(12) United States Patent
Fujiwara et al.

(10) Patent No.: US 11,735,888 B2
(45) Date of Patent: Aug. 22, 2023

(54) SEMICONDUCTOR OPTICAL DEVICE AND METHOD FOR PRODUCING SEMICONDUCTOR OPTICAL DEVICE

(71) Applicant: SUMITOMO ELECTRIC INDUSTRIES, LTD., Osaka (JP)

(72) Inventors: Naoki Fujiwara, Osaka (JP); Hideki Yagi, Osaka (JP); Takuo Hiratani, Osaka (JP); Takehiko Kikuchi, Osaka (JP); Toshiyuki Nitta, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 192 days.

(21) Appl. No.: 17/154,652

(22) Filed: Jan. 21, 2021

(65) Prior Publication Data

US 2021/0249840 A1 Aug. 12, 2021

(30) Foreign Application Priority Data

Feb. 12, 2020 (JP) .................................. 2020-021506

(51) Int. Cl.
*H01S 5/10* (2021.01)
*H01S 5/068* (2006.01)
(Continued)

(52) U.S. Cl.
CPC .......... *H01S 5/1014* (2013.01); *H01S 5/0215* (2013.01); *H01S 5/068* (2013.01);
(Continued)

(58) Field of Classification Search
CPC ...... H01S 5/1014; H01S 5/1064; H01S 5/142; H01S 5/021; H01S 5/1032; H01S 5/0218
See application file for complete search history.

(56) References Cited

U.S. PATENT DOCUMENTS 6,052,397 A * 4/2000 Jeon .......................... H01S 5/10
372/46.01
6,310,995 B1 * 10/2001 Saini .................... G02B 6/1228
385/39
(Continued)

FOREIGN PATENT DOCUMENTS

CN 1547791 A * 11/2004 ........... H01S 5/0265
KR 100433298 B1 * 5/2004
(Continued)

OTHER PUBLICATIONS

Guang-Hua Duan et al. Hybrid III-V on Silicon Lasers for Photonic Integrated Circuits on Silicon., IEEE Journal of Selected Topics in Quantum Electronics, vol. 20, No. 4, Jul./Aug. 2014.

*Primary Examiner* — Joshua King
(74) *Attorney, Agent, or Firm* — Oliff PLC

(57) ABSTRACT

A method for producing a semiconductor optical device includes the steps of bonding a semiconductor chip to an SOI substrate having a waveguide, the semiconductor chip having an optical gain and including a first cladding layer, a core layer, and a second cladding layer that contain III-V group compound semiconductors and are sequentially stacked in this order, forming a covered portion with a first insulating layer on the second cladding layer, etching partway in the thickness direction the second cladding layer exposed from the first insulating film, forming a second insulating film covering from the covered portion to a part of a remaining portion of the second cladding layer, and forming a first tapered portion that is disposed on the waveguide and tapered along the extending direction of the waveguide by etching the core layer and the second cladding layer exposed from the second insulating film.

9 Claims, 19 Drawing Sheets

(51) Int. Cl.
  *H01S 5/22* (2006.01)
  *H01S 5/343* (2006.01)
  *H01S 5/14* (2006.01)
  *H01S 5/02* (2006.01)
  *H01S 5/20* (2006.01)
(52) U.S. Cl.
  CPC ............ *H01S 5/1064* (2013.01); *H01S 5/142* (2013.01); *H01S 5/22* (2013.01); *H01S 5/3434* (2013.01); *H01S 5/021* (2013.01); *H01S 5/0218* (2013.01); *H01S 5/1032* (2013.01); *H01S 5/2086* (2013.01)

(56) References Cited

U.S. PATENT DOCUMENTS

| | | | | |
|---|---|---|---|---|
| 6,411,764 | B1 * | 6/2002 | Lee | G02B 6/1228 |
| | | | | 372/50.1 |
| 7,076,135 | B2 * | 7/2006 | Yamada | G02B 6/305 |
| | | | | 385/129 |
| 8,731,017 | B2 * | 5/2014 | Clifton | H01S 5/3427 |
| | | | | 372/45.01 |
| 9,052,449 | B2 * | 6/2015 | Sagawa | H01S 5/026 |
| 9,134,478 | B2 * | 9/2015 | Park | G02B 6/12 |
| 9,270,078 | B2 * | 2/2016 | Rickman | H01S 3/10053 |
| 9,419,412 | B2 * | 8/2016 | Krishnamurthy | H01S 5/4087 |
| 2002/0031297 | A1 * | 3/2002 | Forrest | B82Y 20/00 |
| | | | | 359/344 |
| 2002/0039469 | A1 * | 4/2002 | Jeong | G02B 6/305 |
| | | | | 385/50 |
| 2002/0097941 | A1 * | 7/2002 | Forrest | H01S 5/0265 |
| | | | | 385/14 |
| 2002/0151095 | A1 * | 10/2002 | Kim | H01S 5/10 |
| | | | | 438/31 |
| 2003/0007719 | A1 * | 1/2003 | Forrest | G02B 6/12004 |
| | | | | 385/14 |
| 2003/0057427 | A1 * | 3/2003 | Chida | H01S 5/227 |
| | | | | 257/98 |
| 2004/0052445 | A1 * | 3/2004 | Forrest | H01S 5/1032 |
| | | | | 385/14 |
| 2005/0084991 | A1 * | 4/2005 | Lee | H01S 5/227 |
| | | | | 438/21 |
| 2005/0094924 | A1 * | 5/2005 | Forrest | G02B 6/12004 |
| | | | | 385/14 |
| 2006/0159133 | A1 * | 7/2006 | Hwang | H01S 5/227 |
| | | | | 372/45.01 |
| 2010/0142579 | A1 * | 6/2010 | Leem | H01S 5/1032 |
| | | | | 372/99 |
| 2011/0135314 | A1 * | 6/2011 | Tolstikhin | H01S 5/0262 |
| | | | | 398/149 |
| 2013/0259077 | A1 * | 10/2013 | Ben Bakir | G02B 6/1228 |
| | | | | 372/44.01 |
| 2014/0241734 | A1 * | 8/2014 | Sagawa | G02B 6/1228 |
| | | | | 398/139 |
| 2014/0269800 | A1 * | 9/2014 | Purnawirman | H01S 3/17 |
| | | | | 359/344 |
| 2015/0146755 | A1 * | 5/2015 | Kim | G02B 6/122 |
| | | | | 438/31 |
| 2015/0226918 | A1 * | 8/2015 | Bauters | H01L 31/105 |
| | | | | 438/31 |
| 2015/0303654 | A1 * | 10/2015 | Petrescu-Prahova | H01S 5/2031 |
| | | | | 372/45.01 |
| 2016/0047983 | A1 * | 2/2016 | Collins | H01S 5/2207 |
| | | | | 438/27 |
| 2016/0131842 | A1 * | 5/2016 | Mahgerefteh | G02B 6/124 |
| | | | | 385/11 |
| 2017/0214216 | A1 * | 7/2017 | Dong | H01S 5/0215 |
| 2018/0331500 | A1 * | 11/2018 | Cheung | H01S 5/4068 |
| 2020/0313397 | A1 * | 10/2020 | Jung | H01S 5/3406 |
| 2021/0126428 | A1 * | 4/2021 | Fujiwara | H01S 5/4062 |
| 2021/0215874 | A1 * | 7/2021 | Koch | G02B 6/12004 |

FOREIGN PATENT DOCUMENTS

| | | | | |
|---|---|---|---|---|
| KR | 20040056555 A | * | 7/2004 | |
| WO | WO-2004074890 A1 | * | 9/2004 | ........... G02B 6/1228 |

* cited by examiner

SEMICONDUCTOR OPTICAL DEVICE AND METHOD FOR PRODUCING SEMICONDUCTOR OPTICAL DEVICE

CROSS-REFERENCE TO RELATED APPLICATION

This application claims priority based on Japanese Patent Application No. 2020-021506 filed on Feb. 12, 2020, and the entire contents of the Japanese patent application are incorporated herein by reference.

FIELD OF THE INVENTION

The present disclosure relates to a semiconductor optical device and method for producing a semiconductor optical device.

BACKGROUND ART

Non Patent Document 1 (Guang-Hua Duan et al. "Hybrid III-V on Silicon Lasers for Photonic Integrated Circuits on Silicon", IEEE JOURNAL OF SELECTED TOPICS IN QUANTUM ELECTRONICS, VOL. 20, NO. 4, JULY/AUGUST 2014) discloses a technique for bonding a gain region formed of III-V group compound semiconductors to a SOI substrate on which a waveguide is formed (so-called silicon photonics). The SOI substrate is provided with a waveguide, a resonator, and the like that are formed of silicon (Si). Each of the III-V group compound semiconductors is of direct transition type and has a high optical gain. Light emitted by the gain region formed of the III-V group compound semiconductors propagates through the waveguide of the SOI substrate.

SUMMARY OF THE INVENTION

A method for producing a semiconductor optical device according to the present disclosure includes the steps of bonding a semiconductor chip to an SOI substrate having a waveguide, the semiconductor, the semiconductor chip having an optical gain and including a first cladding layer, a core layer, and a second cladding layer that contain III-V group compound semiconductors and are sequentially stacked in this order; forming a covered portion with a first insulating layer on the second cladding layer; etching partway in the thickness direction the second cladding layer exposed from the first insulating film; forming a second insulating film covering from the covered portion with the first insulating layer of the second cladding layer to a part of a remaining portion of the second cladding layer that remains in the region of the second cladding layer etched partway in the thickness direction; and forming a first tapered portion that is disposed on the waveguide and tapered along the extending direction of the waveguide by etching the core layer and the second cladding layer that are exposed from the second insulating film.

A semiconductor optical device according to the present disclosure includes a SOI substrate having a waveguide and a gain region having an optical gain. The gain region is provided on the SOI substrate and includes a first cladding layer, a core layer, and a second cladding layer that contain III-V group compound semiconductors and are sequentially stacked in this order. The gain region is located on the waveguide and has a tapered portion that is tapered along the extending direction of the waveguide. The tapered portion is formed of the core layer and the second cladding layer, and has a first portion and a second portion. The second portion is located at the tip of the tapered portion. The second portion has a thickness smaller than that of the first portion.

DESCRIPTION OF EMBODIMENTS

Figure 1A:
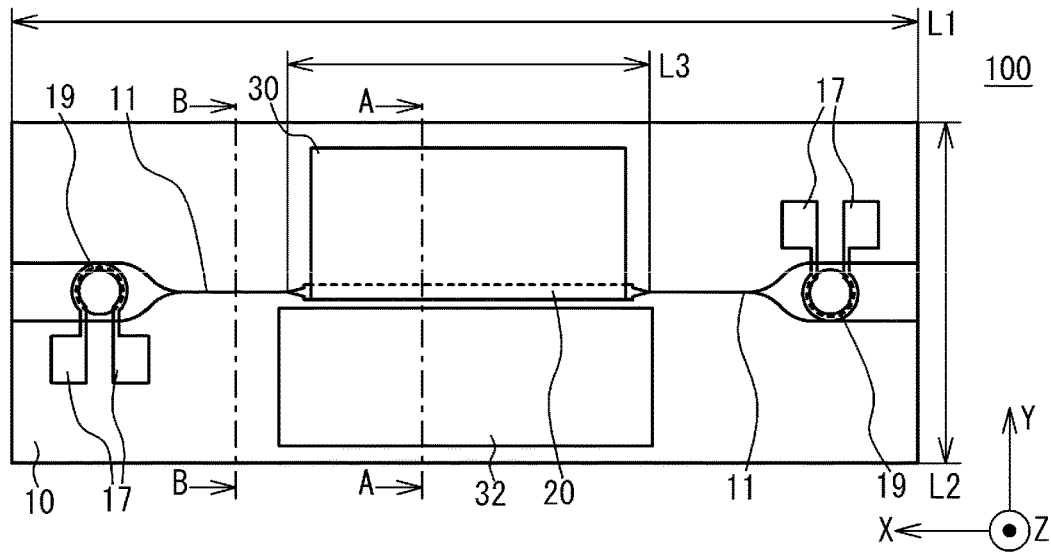
FIG. 1A is a plan view illustrating a semiconductor optical device according to an embodiment.

A coupling efficiency between a gain region and a waveguide greatly affects the characteristics of a semiconductor optical device such as oscillation threshold current density, power consumption, and optical properties including spectral line width or the like. By tapering the tip of the gain region, effective refractive index changes gradually. As a result, light transitions smoothly from the gain region to the waveguide, and thus a higher coupling efficiency can be obtained. However, when the desired tip shape is not obtained, the coupling efficiency is lowered. Accordingly, it is one of objects of the present disclosure to provide a semiconductor optical device and a method for producing a semiconductor optical device that can improve the coupling efficiency between the gain region and the waveguide.

First, the contents of embodiments of the present disclosure will be listed and described.

A method for producing a semiconductor optical device according to an embodiment of the present disclosure includes: (1) the steps of bonding a semiconductor chip to an SOI substrate having a waveguide, the semiconductor chip having an optical gain and including a first cladding layer, a core layer, and a second cladding layer that contain III-V group compound semiconductors and are sequentially stacked in this order; forming a covered portion with a first insulating layer on the second cladding layer; etching partway in the thickness direction the second cladding layer exposed from the first insulating film; forming a second insulating film covering from the covered portion with the first insulating layer of the second cladding layer to a part of a remaining portion of the second cladding layer that remains in the region of the second cladding layer etched partway in the thickness direction; and forming a first tapered portion that is disposed on the waveguide and tapered along the extending direction of the waveguide by etching the core layer and the second cladding layer that are exposed from the second insulating film. The remaining portion of the second cladding layer is removed by etching, and subsequently the core layer is etched, whereby the first tapered portion having a desired shape can be formed. Therefore, the coupling efficiency between the gain region of the semiconductor chip and the waveguide can be increased.

(2) The step of forming the second insulating film may be performed by forming the second insulating film so as to continuously cover a first surface in the extending direction of the waveguide in the covered portion of the second cladding layer covered with the first insulating film and the part of the remaining portion of the second cladding layer along the extending direction of the waveguide, and cover a second surface in a direction intersecting the extending direction of the waveguide in the covered portion of the second cladding layer covered with the first insulating film. It is possible to suppress the progress of etching and to form the first tapered portion having the desired shape.

(3) The step of forming the second insulating film may include the step of patterning the second insulating film by dry etching. The dry etching proceeds in the thickness direction to remove unnecessary parts and leave desired parts in the second insulating film.

(4) The step of forming the first tapered portion may include the step of wet etching the second cladding layer exposed from the second insulating film and the step of dry etching the core layer exposed from the second insulating film after the wet etching. The wet etching selectively etches the second cladding layer and stops when reaching the core layer. The dry etching is performed on the core layer. As a result, the first tapered portion having the desired shape can be formed.

(5) The second cladding layer may contain indium phosphide, and the core layer may contain arsenic. The selectivity of the wet etching between the second cladding layer and the core layer is enhanced and thus the wet etching proceeds selectively to the second cladding layer. Therefore, the first tapered portion having the desired shape can be formed.

(6) The second cladding layer may be thicker than the core layer and the first cladding layer. Since light is less likely to leak from the core layer to an upper side, it is possible to suppress the optical loss. The remaining portion remaining after the etching of the second cladding layer is re-etched and removed, so that the first tapered portion having the desired shape can be formed.

(7) The thickness of the remaining portion of the second cladding layer may be 20% or less of the thickness of the second cladding layer before the etching. The remaining portion remaining after the etching of the second cladding layer is re-etched and removed, so that the first tapered portion having the desired shape can be formed.

(8) The step of etching the second cladding layer partway in the thickness direction may be performed by dry etching the second cladding layer. The remaining portion is left by intentionally stopping the dry etching partway in the thickness direction. Since the remaining portion is etched away, the first tapered portion having the desired shape can be formed.

(9) The method may include the step of etching the first cladding layer to form the second tapered portion that is tapered along the extending direction of the waveguide. The coupling efficiency between the gain region and the waveguide can be further increased.

(10) A semiconductor optical device includes a SOI substrate having a waveguide, and a gain region having an optical gain. The gain region is provided on the SOI substrate and includes a first cladding layer, a core layer, and a second cladding layer that contain III-V group compound semiconductors and are sequentially stacked in this order. The gain region is located on the waveguide and has a tapered portion that is tapered along the extending direction of the waveguide. The tapered portion is formed of the core layer and the second cladding layer, and has a first portion and a second portion. The second portion is located at the tip of the tapered portion. The second portion has a thickness smaller than that of the first portion. By forming the tapered portion, the coupling efficiency between the gain region and the waveguide can be increased.

DETAILS OF EMBODIMENTS OF THE PRESENT DISCLOSURE

Specific examples of a semiconductor optical device and a method for producing a semiconductor optical device according to embodiments of the present disclosure will be described below with reference to the drawings.
(Semiconductor Optical Device)

Figure 1B:
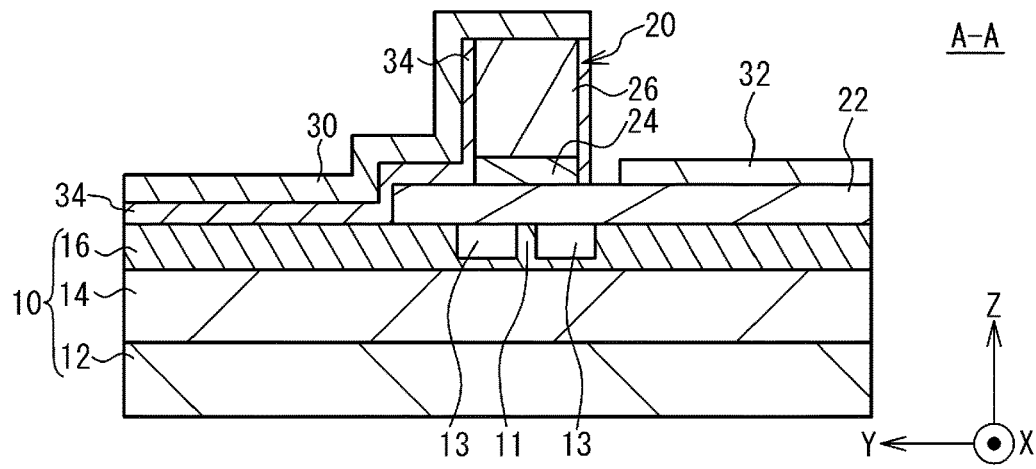
FIG. 1B is a cross-sectional view along line A-A in FIG. 1A.
Figure 1C:
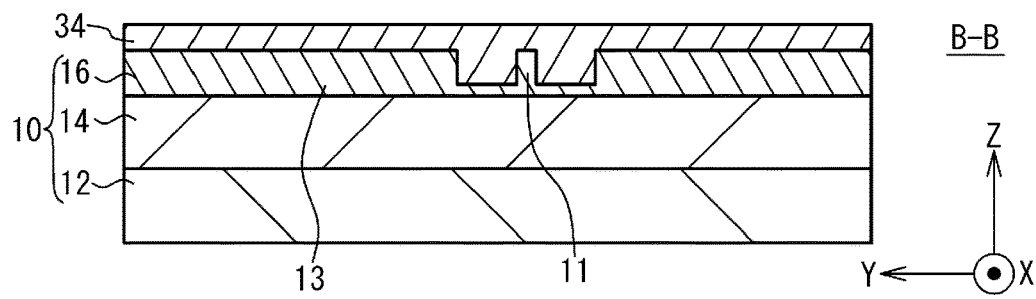
FIG. 1C is a cross-sectional view along line B-B in FIG. 1A.

FIG. 1A is a plan view illustrating a semiconductor optical device 100 according to an embodiment. FIG. 1B is a cross-sectional view along line A-A in FIG. 1A. FIG. 1C is a cross-sectional view along line B-B in FIG. 1A.

As illustrated in FIG. 1A, the semiconductor optical device 100 is a hybrid-type wavelength tunable laser diode including a substrate 10 and a gain region 20. An X-axis direction, a Y-axis direction and a Z-axis direction are perpendicular to each other. The top surface of the substrate 10 extends in an XY-plane. The substrate 10 has sides extending in the X-axis direction and sides extending in the Y-axis direction. The top surface of the substrate 10 is provided with the gain region 20, two ring resonators 19, and electrodes 17, 30 and 32. As will be described later, the gain region 20 is formed of a III-V group semiconductor chip that is to be bonded to the substrate 10 and functions as a laser diode. For example, a plurality of gain regions 20 may be provided on the substrate 10, and a part of the plurality of gain regions 20 may function as a semiconductor optical amplifier or the like. The top surface of the semiconductor optical device 100 is covered with an insulating film (not illustrated).

As illustrated in FIGS. 1A and 1B, the substrate 10 is a SOI substrate including a Si substrate 12, a silicon dioxide ($SiO_2$) layer 14 and a silicon (Si) layer 16 stacked in this order. The Si substrate 12 is formed of silicon. The thickness of the $SiO_2$ layer 14 is 2 m, for example. The thickness of the Si layer 16 is 220 nm, for example. The Si layer 16 of the substrate 10 is provided with a waveguide 11 and the ring resonators 19 illustrated in FIG. 1A.

As illustrated in FIG. 1B, the Si layer 16 of the substrate 10 is provided with the waveguide 11 and grooves 13. For example, the grooves 13 are recesses formed in the top surface of the Si layer 16, and do not penetrate the Si layer 16 in the thickness direction. The grooves 13 are located on the both sides of one waveguide 11 along the Y-axis direction. The sides of the waveguide 11 that overlaps with the gain region 20 in plan view of the substrate 10 are exposed to air. As illustrated in FIG. 1C, the waveguide 11 that does not overlap with the gain region 20 is covered by an insulating film 34, and both sides of the waveguide 11 are embedded with the insulating film 34. The width of the waveguide 11 in the Y-axis direction is 1 μm, for example.

The width of the groove 13 is 5 μm, for example. Although the cross-sectional view of the ring resonator 19 is not illustrated, the waveguide formed in the Si layer 16 is bent, so that the ring resonators 19 illustrated in FIG. 1A are formed. The electrodes 17 are provided on the ring resonators 19 and are formed of metals such as Ti or the like.

As illustrated in FIG. 1A, the waveguide 11 extends in the X-axis direction, and branches into two directions in each of areas between the gain region 20 and the ring resonators 19. The waveguide 11 is then optically coupled to the ring resonators 19, and reaches the end portion of the substrate 10. An optical antireflection coating is provided on the end face of the substrate 10. A length L1 of the semiconductor optical device 100 in the X-axis direction is 2000 μm, for example, and a length L2 in the Y-axis direction is 600 μm, for example.

A refractive index of silicon is about 3.5 and a refractive index of $SiO_2$ is about 1.4. The difference in refractive index between these two materials is large. Therefore, when the waveguide 11 is formed of Si, and the insulating film 34 having a refractive index lower than that of Si is used as a cladding layer, strong optical confinement in the waveguide 11 occurs. Therefore, the optical loss due to bending of the waveguide 11 is suppressed, and branching of the waveguide 11, the ring resonator 19, or the like can be formed in the Si layer 16, for example.

As illustrated in FIGS. 1B and 1C, the insulating film 34 is provided on the top surface of the substrate 10. The ring resonator 19 is also covered with the insulating film 34 similarly to FIG. 1C. As illustrated in FIG. 1B, an n-type semiconductor layer 22 and the insulating film 34 are provided between the electrodes 30 and 32, and the waveguide 11. The electrodes 30 and 32 are not in contact with the waveguide 11. The insulating film 34 is formed of an insulator such as $SiO_2$ having a thickness of 1.5 μm, for example.

As illustrated in FIG. 1A, the gain region 20 extends in the X-axis direction, and is located on the waveguide 11 to be in evanescent optical coupling with the waveguide 11. A length L3 of the gain region 20 in the X-axis direction is 1000 μm, for example. As illustrated in FIG. 1B, the gain region 20 has a mesa shape protruding in the Z-axis direction from the top surface of the substrate 10, and has the n-type semiconductor layer 22 (first cladding layer), a core layer 24, and a p-type semiconductor layer 26 (second cladding layer) stacked in this order from the substrate 10 side. The n-type semiconductor layer 22 is located on the waveguide 11 and the grooves 13, and extends over the substrate 10 more widely than the core layer 24 and the p-type semiconductor layer 26. The core layer 24 and the p-type semiconductor layer 26 are located above the waveguide 11 and the grooves 13. The insulating film 34 covers the sides of the core layer 24 and the p-type semiconductor layer 26, and the top surface of the substrate 10.

The n-type semiconductor layer 22 is formed of, for example, an n-type indium phosphide (n-InP) layer having a thickness of 400 nm. The p-type semiconductor layer 26 is formed of, for example, a p-type InP (p-InP) layer having a thickness of 2 μm. The n-type semiconductor layer 22 and the p-type semiconductor layer 26 have refractive indexes lower than that of the core layer 24 and function as cladding layers.

The core layer 24 is formed of an undoped gallium indium arsenide phosphide (i-GaInAsP), for example, and has a multi quantum well structure (MQW) including a plurality of well layers and barrier layers stacked alternately. The thickness of the core layer 24 is 300 nm, for example. The number of well layers is 8, for example. The core layer 24 has an optical gain in the vicinity of a wavelength of 1.55 µm, for example. The optical gain of the core layer 24 can be adjusted by the number, the thickness, the composition, or the like of each of the well layer and the barrier layer in the core layer 24.

The electrode 32 is an n-type ohmic electrode. The electrode 32 is provided on the top surface of the n-type semiconductor layer 22 and is electrically connected to the n-type semiconductor layer 22. The electrode 30 is a p-type ohmic electrode. The electrode 30 is provided from the top surface of the p-type semiconductor layer 26 to the top surface of the insulating film 34, and is electrically connected to the p-type semiconductor layer 26. The electrodes 30 and 32 can be contacted with probes and can also be connected to bonding wires.

The electrode 30 is a stacked body including titanium, platinum and gold (Ti/Pt/Au), for example. The electrode 32 includes metals such as an alloy of gold, germanium and nickel (AuGeNi), for example. Each thickness of the electrodes 30 and 32 is 1 µm, for example. Each width of the electrodes 30 and 32 in the Y-axis direction is, 100 µm or more, for example. Au-plated layers or the like may be provided on the electrodes 30 and 32.

Figure 2A:
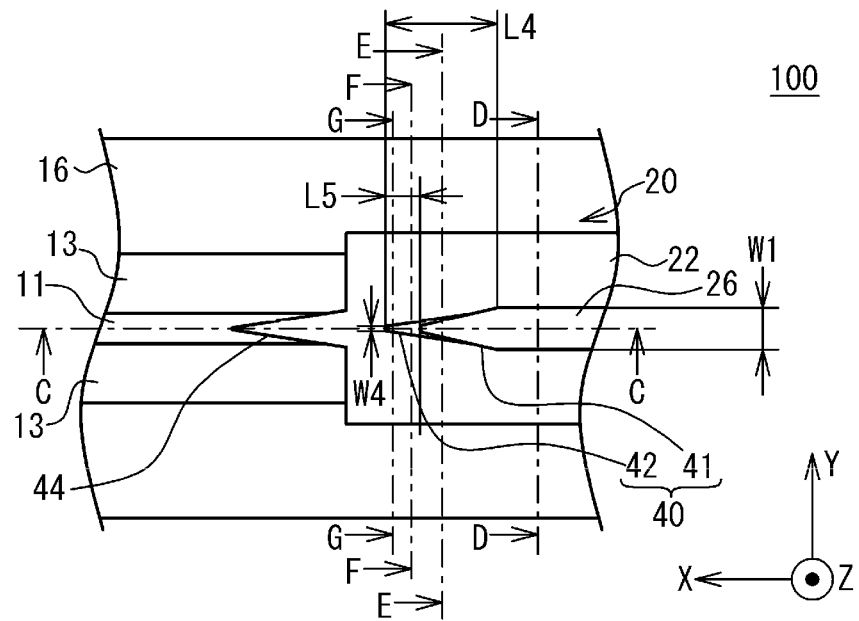
FIG. 2A is an enlarged plan view of the tip of a gain region.
Figure 2B:
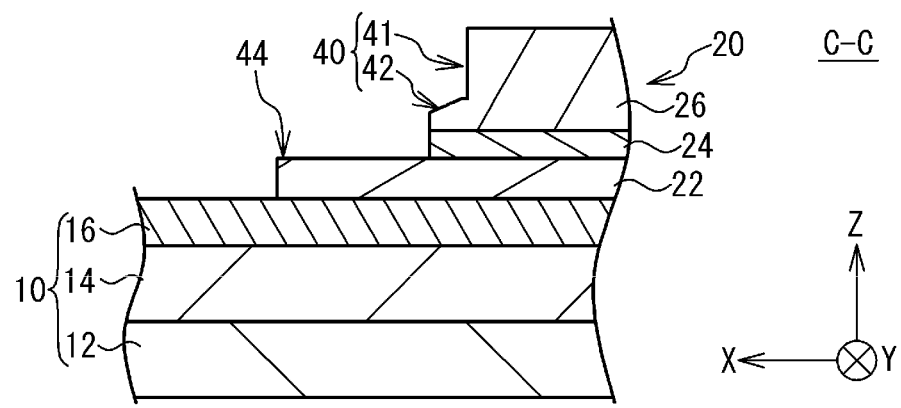
FIG. 2B is a cross-sectional view along line C-C in FIG. 2A.

FIG. 2A is an enlarged plan view of the tip of the gain region 20. FIG. 2B is a cross-sectional view along line C-C in FIG. 2A. The illustration of the electrodes 30 and 32, and the insulating film 34 is omitted. As illustrated in FIGS. 2A and 2B, the gain region 20 has two tapered portions 40 and 44. The tapered portions 40 and 44 are located above the waveguide 11 and taper along the X-axis direction which is the extending direction of the waveguide 11. The tapered portion 40 (first tapered portion) is formed of the core layer 24 and the p-type semiconductor layer 26. The tapered portion 44 (second tapered portion) is located closer to the tip of the gain region 20 than the tapered portion 40, and is formed of the n-type semiconductor layer 22.

The tapered portion 40 includes a base portion 41 (first part) and a tip portion 42 (second part). The tip portion 42 is located at the tip of the tapered portion 40 and is finer and thinner than the base portion 41. The base portion 41 is located between apart of the gain region 20 other than the tapered portion 40 and the tip portion 42. As illustrated in FIG. 2A, the base portion 41 and the tip portion 42 of the first tapered portion 40, and the second tapered portion 44 are arranged in this order along the extending direction of the waveguide 11. The shape of each of the tapered portions 40 and 44 may be a V-shape, a bent shape including a plurality of straight lines, or a curved shape, for example.

A width W1 of the p-type semiconductor layer 26 in the Y-axis direction in a part other than the tapered portion 40 of the p-type semiconductor layer 26 illustrated in FIG. 2A is 3 µm, for example. A width W4 of the tip of the tapered portion 40 is 0.4 µm, for example, and a length L4 of the tapered portion 40 in the X-axis direction is 70 µm, for example. A length L5 from the tip of the base portion 41 to the tip portion 42 is 5 µm, for example.

Figure 3A:
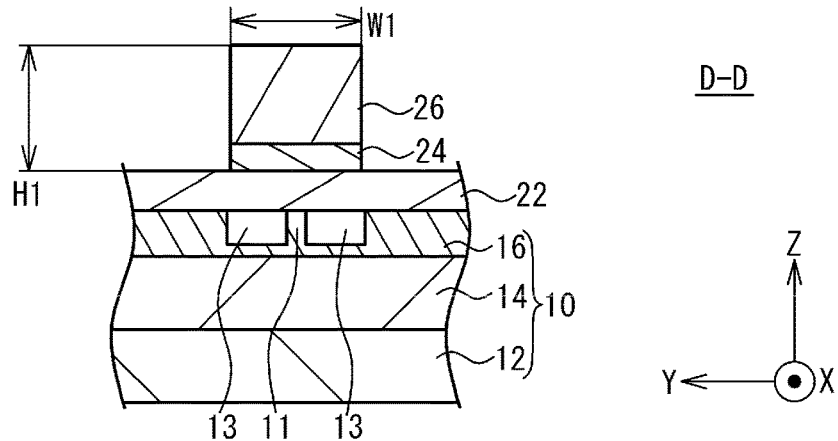
FIG. 3A is a cross-sectional view along line D-D in FIG. 2A.
Figure 3B:
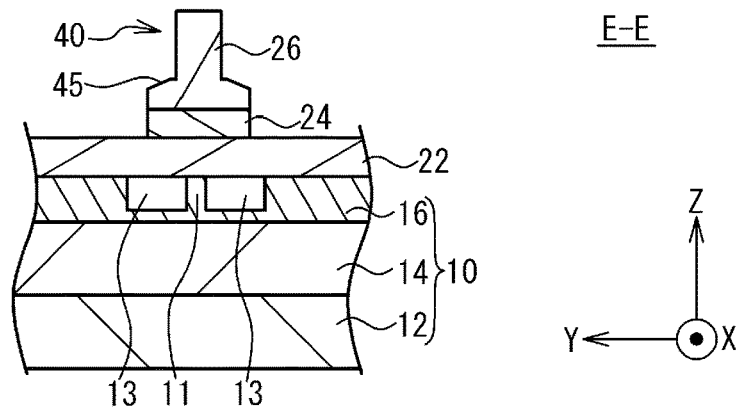
FIG. 3B is a cross-sectional view along line E-E in FIG. 2A.
Figure 3C:
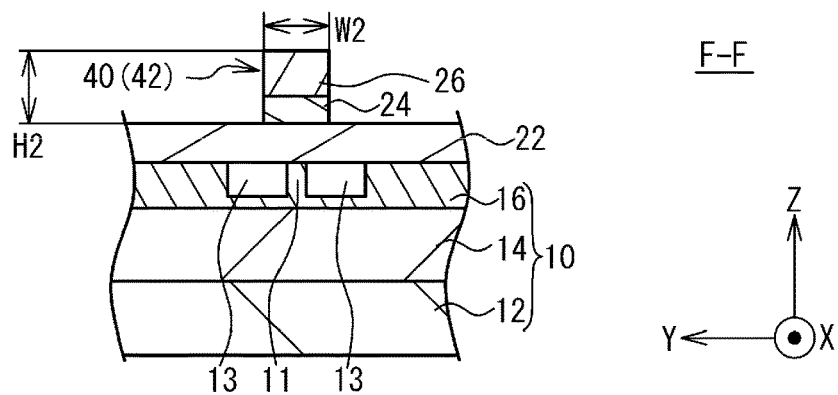
FIG. 3C is a cross-sectional view along line F-F in FIG. 2A.
Figure 3D:
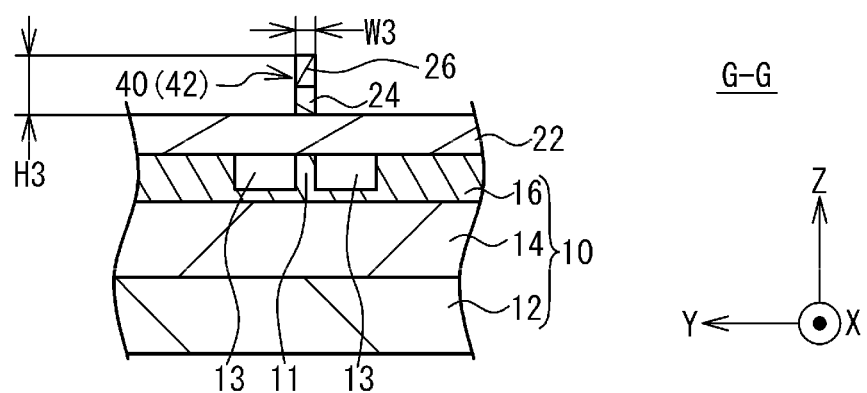
FIG. 3D is a cross-sectional view along line G-G in FIG. 2A.

FIG. 3A is a cross-sectional view along line D-D in FIG. 2A. FIG. 3B is a cross-sectional view along line E-E in FIG. 2A. FIG. 3C is a cross-sectional view along line F-F in FIG. 2A. FIG. 3D is a cross-sectional view along line G-G in FIG. 2A. The width W1 of the p-type semiconductor layer 26 illustrated in FIG. 3A is larger than a width W2 of the tip portion 42 illustrated in FIG. 3C, and the width W2 is larger than a width W3 of the tip portion 42 illustrated in FIG. 3D. A height H1 from the n-type semiconductor layer 22 to the top surface of the p-type semiconductor layer 26 illustrated in FIG. 3A is larger than a height H2 of the tip portion 42 illustrated in FIG. 3C, and the height H2 is larger than a height H3 of the tip portion 42 illustrated in FIG. 3D. The widths and the heights of the tip portion 42 decrease with distance from the base portion 41. As illustrated in FIG. 3B, a step 45 is formed in a part of the tapered portion 40.

As illustrated in FIG. 1B, the gain region 20 has a p-i-n structure along the Z-axis direction. By applying a voltage to the electrode 30 and grounding the electrode 32, carriers are injected into the core layer 24 of the gain region 20 to obtain an optical gain. Light emitted from both ends of the gain region 20 transitions from the gain region 20 to the waveguide 11, propagates through the waveguide 11, and enters the ring resonators 19. Each of the ring resonator 19 reflects a part of the light to the gain region 20 and transmits a part of the light. Light can be emitted from all the four waveguides 11 reaching the end portion of the substrate 10. Generally, an optical fiber (not illustrated) is optically coupled to one of the four waveguides 11, and light extracted from the optical fiber is used. All four lights emitted from the four waveguides 11 of the semiconductor optical device 100 may be utilized.

The ring resonator 19 has a plurality of reflection peaks depending on the length of the ring. The lengths of rings of the two ring resonators 19 are different from each other, and thus reflection spectra are different from each other. The wavelengths of the reflection peaks that match each other in the two ring resonators 19 are an oscillation wavelength of the semiconductor optical device 100. The electrode 17 functions as a heater which generates heat by inputting an electric power. By changing the temperature of the ring resonator 19 using the electrode 17, the refractive index of the ring resonator 19 can be changed, and the wavelength of the reflection peak can be shifted. Depending on the calorific value of the electrode 17, the oscillation wavelength may be variable within the range of 40 nm, for example. That is, the semiconductor optical device 100 functions as the hybrid-type wavelength tunable laser diode.

By gradually varying the effective refractive index along the extending direction of the waveguide 11 in the tapered portions 40 and 44 of the gain region 20, it is possible to smoothly perform transition of light from the gain region 20 to the waveguide 11. It is effective to shape the tapered portion 40 with a high accuracy to improve the coupling efficiency.

(Method for Producing a Semiconductor Optical Device)

Figure 4A:
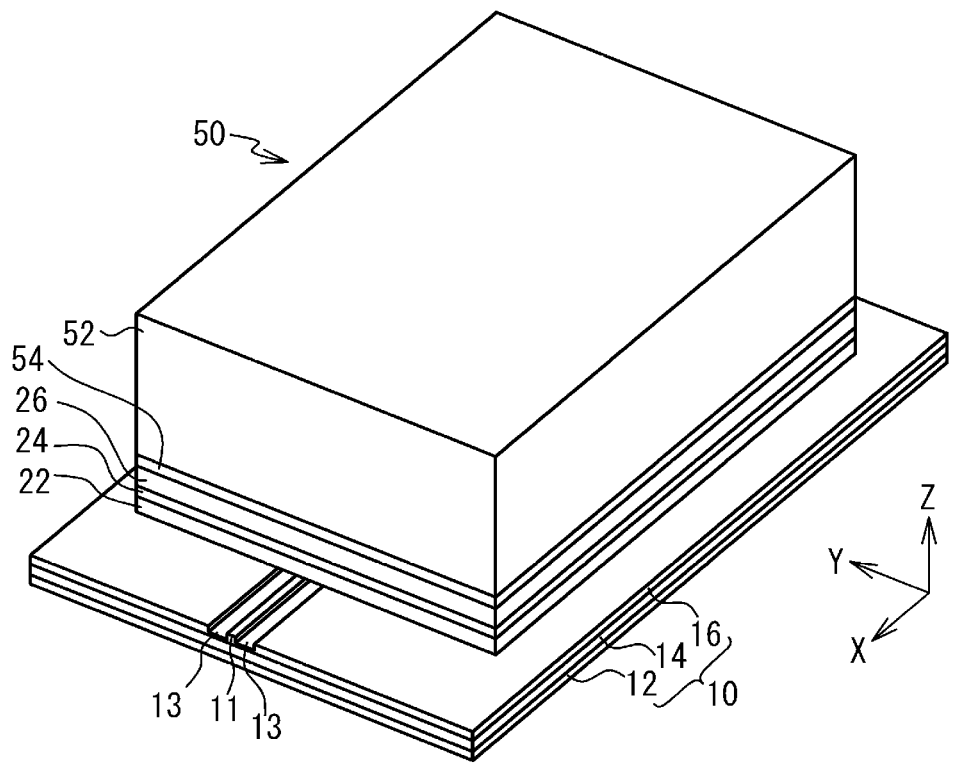
FIG. 4A is a perspective view illustrating a method for producing a semiconductor optical device.
Figure 4B:
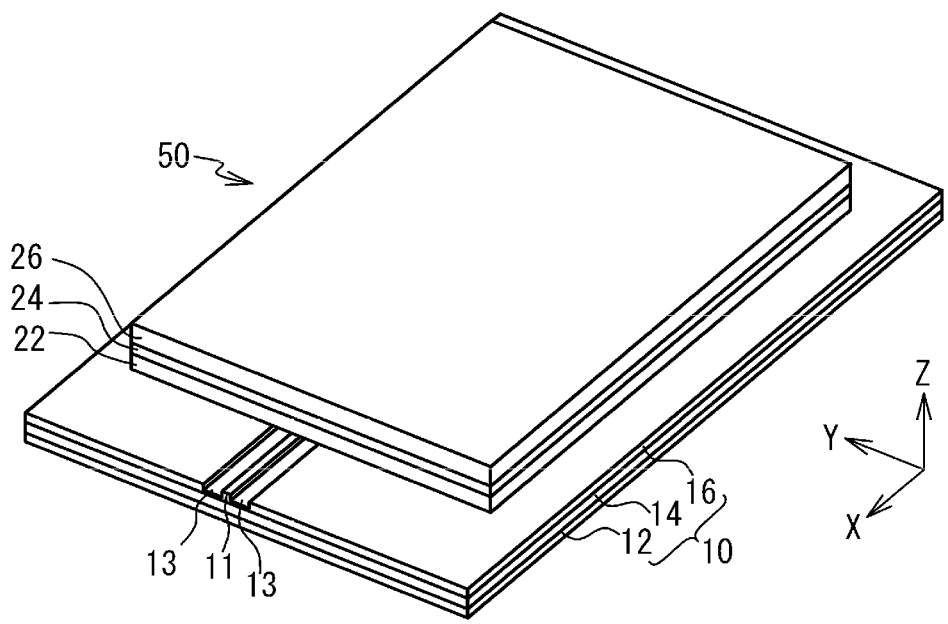
FIG. 4B is a perspective view illustrating a method for producing a semiconductor optical device.

Next, a method for producing the semiconductor optical device 100 according to an embodiment of the present disclosure will be described. FIGS. 4A and 4B are perspective views illustrating the method for producing the semiconductor optical device 100. FIGS. 5A to 7B are plan views illustrating the method for producing the semiconductor optical device 100. FIGS. 8A to 16C are cross-sectional views illustrating the method for producing the semiconductor optical device 100. FIGS. 8A to 10 are cross-sectional views along the X-axis direction. FIGS. 11 to 16C are cross-sectional views along the Y-axis direction.

Prior to the steps illustrated in FIGS. 4A and 4B, dry etching is performed on the Si layer 16 of the substrate 10 in wafer state to form, for example, the plurality of waveguides 11, the plurality of ring resonators 19 and the like. On a compound semiconductor wafer (i.e., a substrate 52) formed of InP, for example, a compound semiconductor layer is formed by an organometallic vapor phase epitaxy (OMVPE) or the like. The compound semiconductor layer includes an etching stop layer 54 formed of GaInAs, the p-type semiconductor layer 26, the core layer 24, and the n-type semiconductor layer 22 stacked in this order from the substrate 52. Dicing is performed on the compound semiconductor wafer to form a plurality of semiconductor chips 50. As illustrated in FIG. 4A, each semiconductor chip 50 includes the substrate 52, the etching stop layer 54, the p-type semiconductor layer 26, the core layer 24, and the n-type semiconductor layer 22. A length of one side of the semiconductor chip 50 is 2 mm, for example.

As illustrated in FIG. 4A, the semiconductor chip 50 is bonded onto the waveguide 11 of the substrate 10 by a surface activated bonding method using nitrogen ($N_2$) plasma, for example. A surface of the Si layer 16 in the substrate 10 and a surface of the n-type semiconductor layer 22 in the semiconductor chip 50 are activated by irradiating plasma, and are bonded each other. By arranging the plurality of semiconductor chips 50 on a receiving pan (susceptor, not illustrated) and disposing the substrate 10 to be opposed to the susceptor, the plurality of semiconductor chips 50 can be bonded to the substrate 10 at a time. As illustrated in FIG. 4B, the substrate 52 and the etching stop layer 54 are removed by wet etching or the like. After the wet etching, the p-type semiconductor layer 26 is exposed.

Figure 5A:
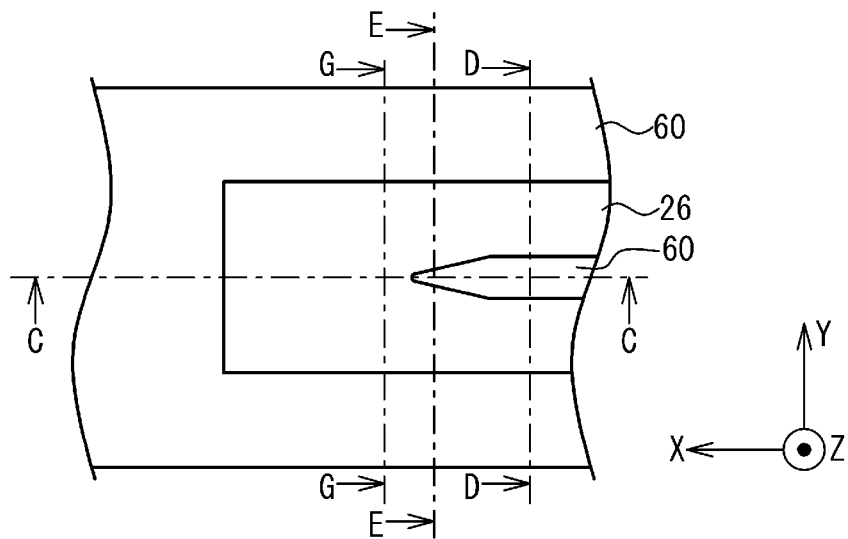
FIG. 5A is a plan view illustrating a method for producing a semiconductor optical device.
Figure 5B:
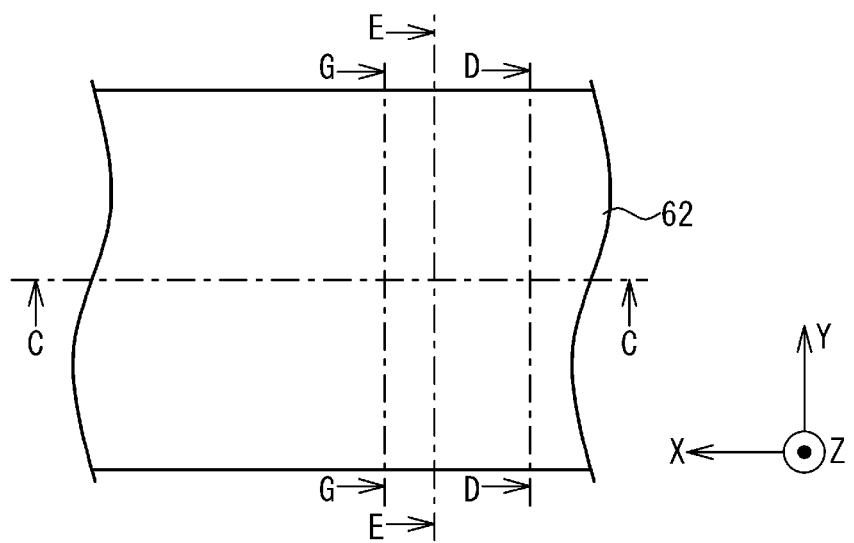
FIG. 5B is a plan view illustrating a method for producing a semiconductor optical device.
Figure 8A:
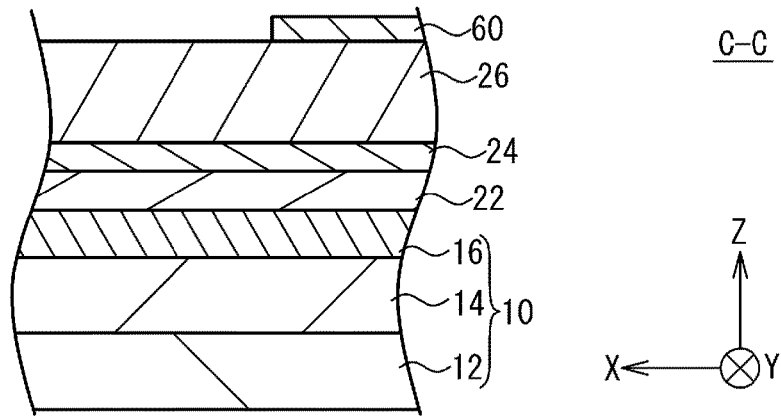
FIG. 8A is a cross-sectional view illustrating a method for producing a semiconductor optical device.
Figure 11:
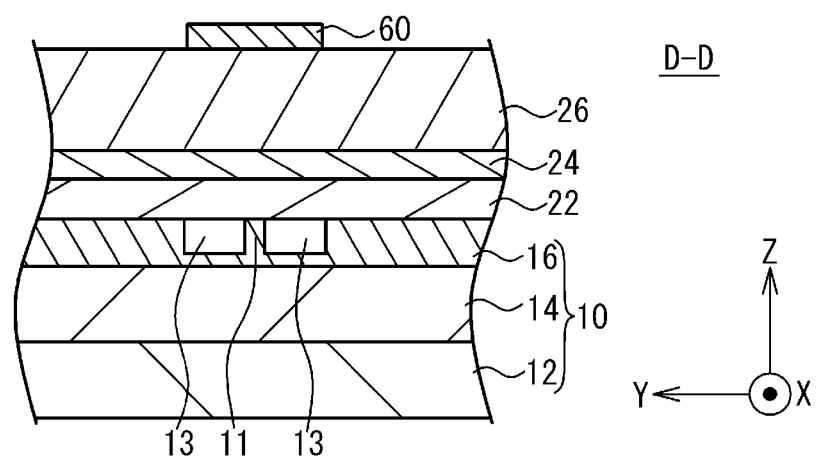
FIG. 11 is a cross-sectional view illustrating a method for producing a semiconductor optical device.

FIG. 5A is a plan view after etching the substrate 52 and the etching stop layer 54. FIG. 8A is a cross-sectional view along line C-C in FIG. 5A. FIG. 11 is a cross-sectional view along line D-D in FIG. 5A. As illustrated in FIGS. 5A, 8A and 11, an insulating film 60 (first insulating film) is provided on the p-type semiconductor layer 26 by a plasma chemical vapor deposition (CVD) method or the like. The insulating film 60 is subsequently patterned with resist patterning followed by dry etching with CF (fluorocarbon), wet etching with BHF (buffered hydrofluoric acid), or the like. The insulating film 60 is formed of an insulator such as a $SiO_2$ layer having a thickness of 500 nm.

As illustrated in FIG. 5A, the patterned insulating film 60 has a tapered shape along the X-axis direction which is the extending direction of the waveguide 11. In FIG. 5A, the insulating film 60 also remains on the region outside the p-type semiconductor layer 26, i.e., on the waveguide 11 and the Si layer 16. The insulating film 60 has openings only where the p-type semiconductor layer 26 is to be dry etched. As illustrated in FIG. 8A, a part of the p-type semiconductor layer 26 is exposed from the insulating film 60. As illustrated in FIG. 11, a part of the p-type semiconductor layer 26 on sides intersecting the extending direction of the waveguide 11 (both sides in the Y-axis direction) is exposed from the insulating film 60. Using the insulating film 60 as a mask, the dry etching is performed on the parts of the p-type semiconductor layer 26 exposed from the insulating film 60.

Figure 8B:
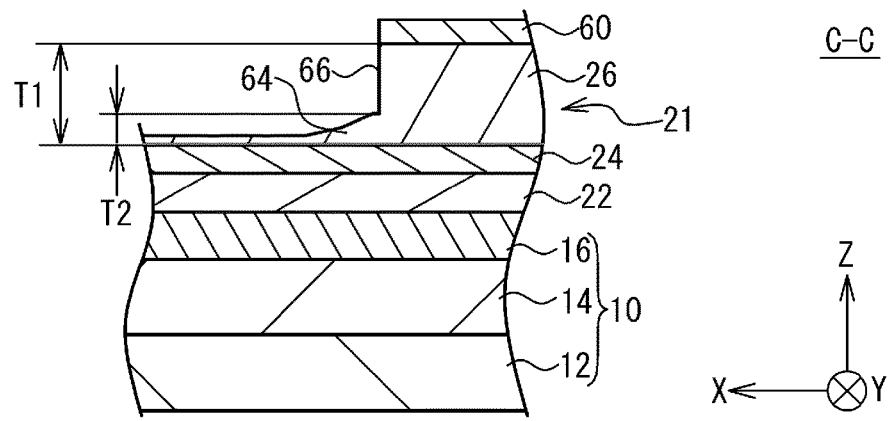
FIG. 8B is a cross-sectional view illustrating a method for producing a semiconductor optical device.
Figure 12A:
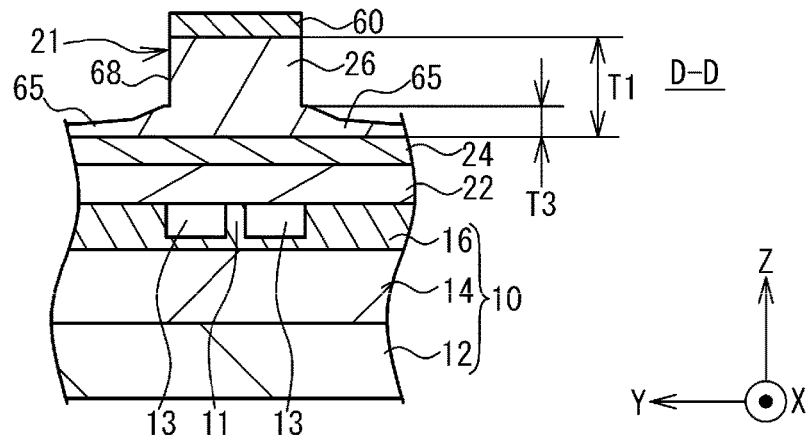
FIG. 12A is a cross-sectional view illustrating a method for producing a semiconductor optical device.
Figure 12B:
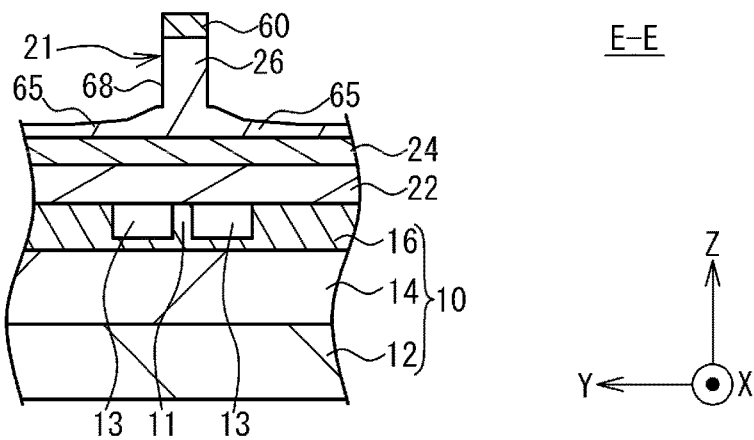
FIG. 12B is a cross-sectional view illustrating a method for producing a semiconductor optical device.
Figure 12C:
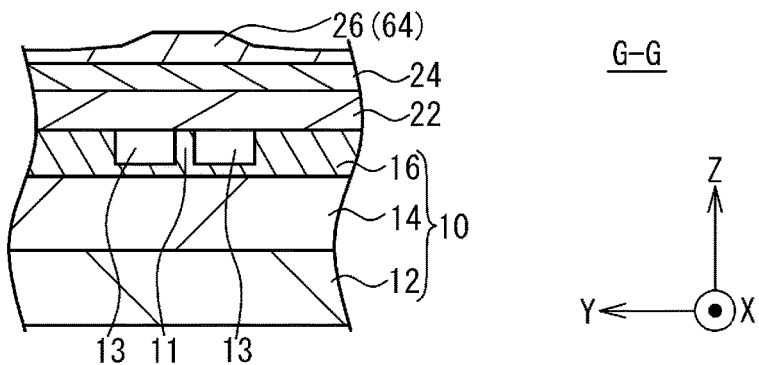
FIG. 12C is a cross-sectional view illustrating a method for producing a semiconductor optical device.

The plan view after the dry etching is the same as that of FIG. 5A. FIGS. 8B, 12A to 12C show the configuration after the dry etching of the p-type semiconductor layer 26. FIG. 8B illustrates a cross-sectional view along line C-C in FIG. 5A. FIG. 12A illustrates a cross-sectional view along line D-D in FIG. 5A. FIG. 12B illustrates a cross-sectional view along line E-E in FIG. 5A. FIG. 12C illustrates a cross-sectional view along line G-G in FIG. 5A.

As illustrated in FIG. 8B, the portion of the p-type semiconductor layer 26 covered with the insulating film 60 is not etched and forms a mesa 21. Since the tapered insulating film 60 is used as a mask, the mesa 21 also has a tapered shape as illustrated in FIGS. 12A and 12B. As illustrated in FIGS. 8B and 12A to 12C, the dry etching proceeds partway in the thickness direction (Z-axis direction), and a part of the p-type semiconductor layer 26 remains. The core layer 24 and the n-type semiconductor layer 22 are not dry etched. The parts of the p-type semiconductor layer 26 remaining in dry etched regions are designated as remaining portions 64 and 65.

A surface 66 illustrated in FIG. 8B is a surface of the tip in the X-axis direction of the p-type semiconductor layer 26 formed by dry etching. The remaining portion 64 extends from the surface 66 toward the X-axis direction which is the extending direction of the waveguide 11 so as to trail a hem. The remaining portion 64 inclines along the X-axis direction and gets thinner as it moves away from the surface 66. A surface 68 illustrated in FIGS. 12A and 12B is a side surface on each side in the Y-axis direction of the p-type semiconductor layer 26 formed by dry etching. The remaining portion 65 extends from the surface 68 toward each direction of the Y-axis intersecting the extending direction of the waveguide 11 so as to trail the hem. The remaining portion 65 inclines along the Y-axis direction and gets thinner as it moves away from the surface 68.

The thickness T1 of the p-type semiconductor layer 26 illustrated in FIGS. 8B and 12A is, for example, 2 μm as described above. The thickness T2 of the remaining portion 64 and the thickness T3 of the remaining portion 65 are equal to each other. Each of the thickness T2 and T3 is less than the thickness T1, and, for example, about 200 nm which is about 10% of the thickness T1 at most.

Figure 8C:
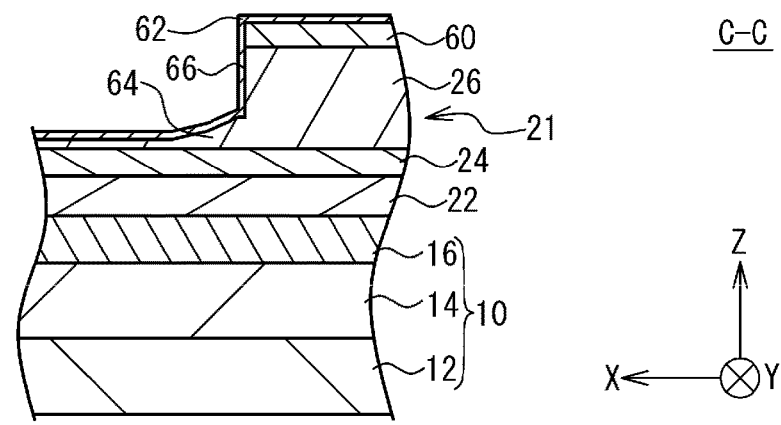
FIG. 8C is a cross-sectional view illustrating a method for producing a semiconductor optical device.
Figure 13A:
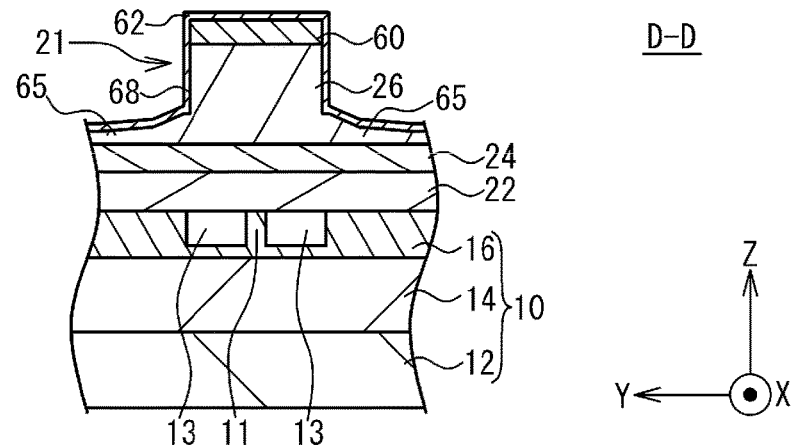
FIG. 13A is a cross-sectional view illustrating a method for producing a semiconductor optical device.
Figure 13B:
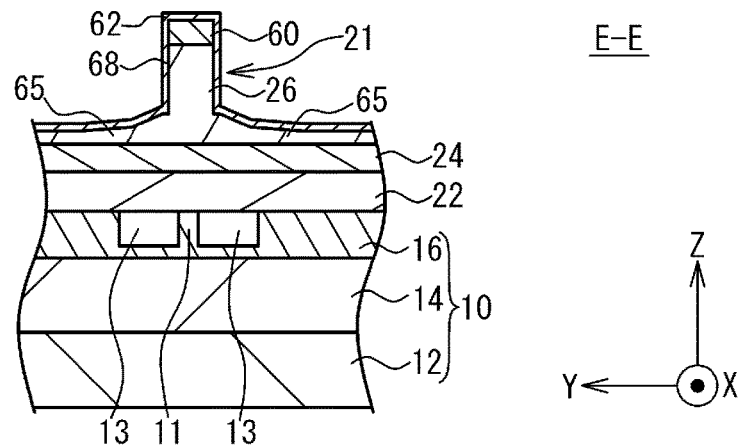
FIG. 13B is a cross-sectional view illustrating a method for producing a semiconductor optical device.
Figure 13C:
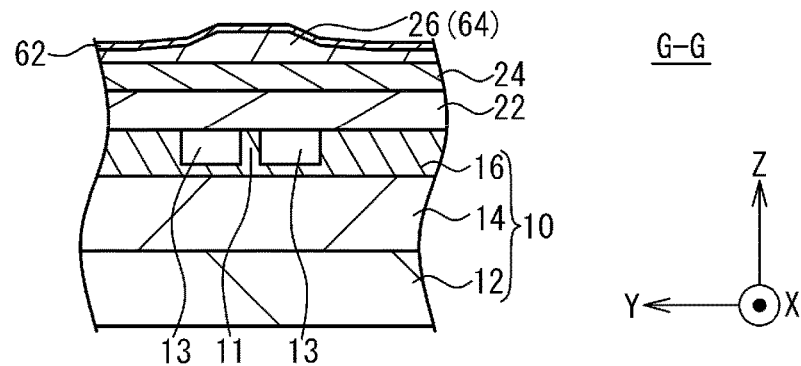
FIG. 13C is a cross-sectional view illustrating a method for producing a semiconductor optical device.

As illustrated in FIGS. 5B, 8C, and 13A to 13C, an insulating film 62 (second insulating film) is formed by, for example, an atomic layer deposition (ALD) method, the plasma chemical vapor deposition (CVD) method or the like. The insulating film 62 is formed of an insulator such as a $SiO_2$ layer with a thickness of 50 nm, for example. FIG. 8C illustrates a cross-sectional view along line C-C in FIG. 5B. FIG. 13A illustrates a cross-sectional view along line D-D in FIG. 5B. FIG. 13B illustrates a cross-sectional view along line E-E in FIG. 5B. FIG. 13C illustrates a cross-sectional view along line G-G in FIG. 5B. The insulating film 62 covers the top surface of the insulating film 60, the surface 66 on the tip side of the mesa 21, and the top surface of the remaining portion 64, as illustrated in FIG. 8C, and also covers the surface 68 of the mesa 21 and the top surface of the remaining portion 65, as illustrated in FIGS. 13A and 13B.

Figure 6A:
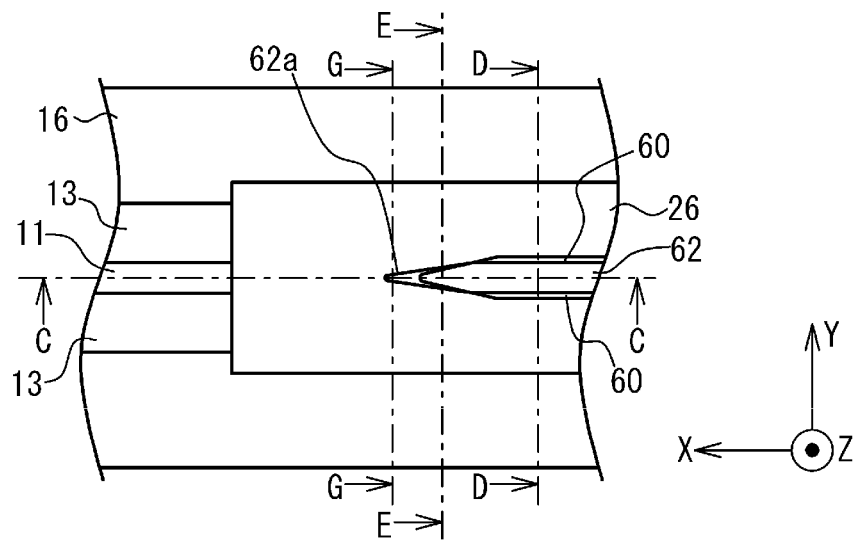
FIG. 6A is a plan view illustrating a method for producing a semiconductor optical device.
Figure 9A:
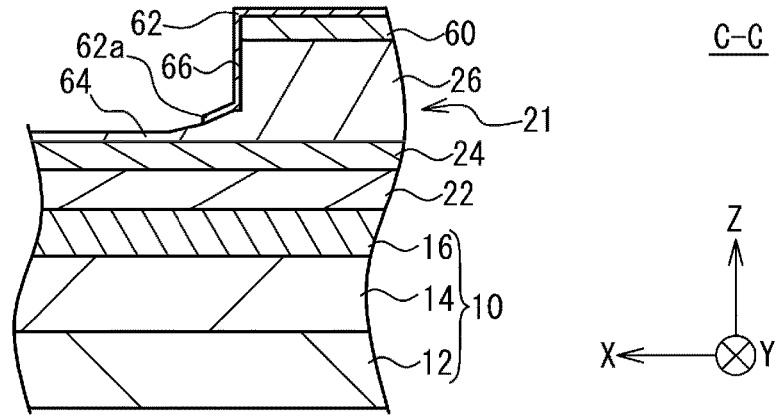
FIG. 9A is a cross-sectional view illustrating a method for producing a semiconductor optical device.
Figure 14A:
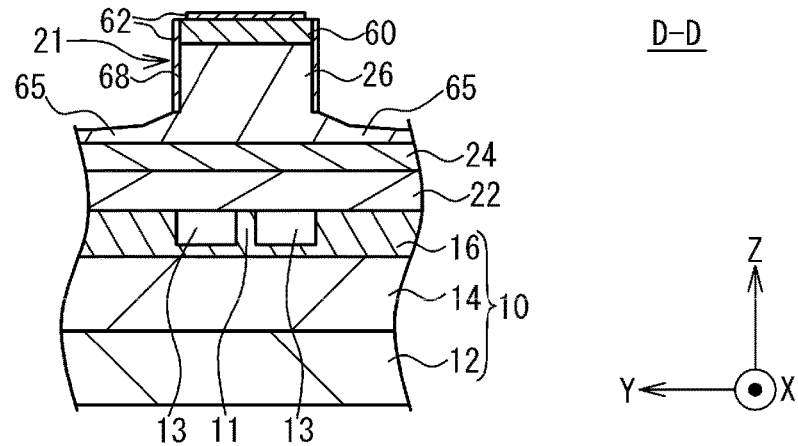
FIG. 14A is a cross-sectional view illustrating a method for producing a semiconductor optical device.
Figure 14B:
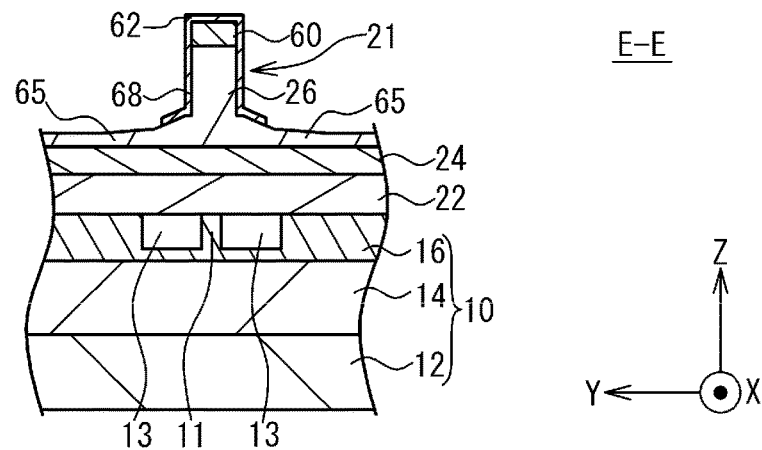
FIG. 14B is a cross-sectional view illustrating a method for producing a semiconductor optical device.
Figure 14C:
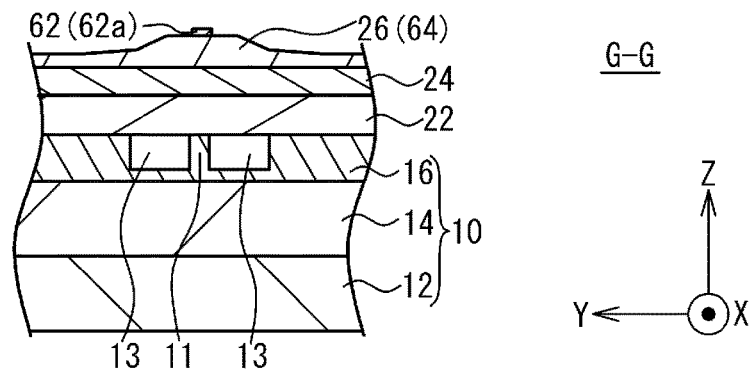
FIG. 14C is a cross-sectional view illustrating a method for producing a semiconductor optical device.

The insulating film 62 is patterned as illustrated in FIGS. 6A, 9A, and 14A to 14C. Specifically, a part of the insulating film 62 is removed by dry etching after forming a resist pattern (not illustrated) on the insulating film 62. FIG. 6A is a plan view illustrating the configuration after the patterning of the insulating film 62. FIG. 9A illustrates a cross-sectional view along line C-C in FIG. 6A. FIG. 14A illustrates a cross-sectional view along line D-D in FIG. 6A. FIG. 14B illustrates a cross-sectional view along line E-E in FIG. 6A. FIG. 14C illustrates a cross-sectional view along line G-G in FIG. 6A. As illustrated in FIGS. 6A and 14A to 14C, the insulating film 62 is patterned into a tapered shape along the X-axis direction.

As illustrated in FIGS. 6A and 14A, the insulating film 62 on the mesa 21 is partially removed to expose a part of the top surface of the insulating film 60. As illustrated in FIGS. 14A and 14B, the part of the insulating film 62 covering the surface 68 of the mesa 21 remains, but the part of the insulating film 62 that is away from the mesa 21 is removed. The remaining portion 65 of the p-type semiconductor layer 26 is exposed from the insulating film 62.

As illustrated in FIG. 9A, the top surface and the surface 66 on the tip side of the p-type semiconductor layer 26 are covered with the insulating film 62. As illustrated in FIGS. 9A and 14C, a tip part 62a of the insulating film 62 protrudes in the X-axis direction beyond the surface 66 and covers the part of the remaining portion 64 of the p-type semiconductor layer 26 that is close to the mesa 21 in the X-axis direction. The part of the remaining portion 64 far from the mesa 21 is exposed from the insulating film 62. The insulating film 62 covers from a covered portion with the insulating film 60 of the p-type semiconductor layer 26 to a part of the remaining portion 64. As illustrated in FIG. 6A, a width of the tip part 62a of the insulating film 62 is smaller than that of the other part of the insulating film 62.

Figure 6B:
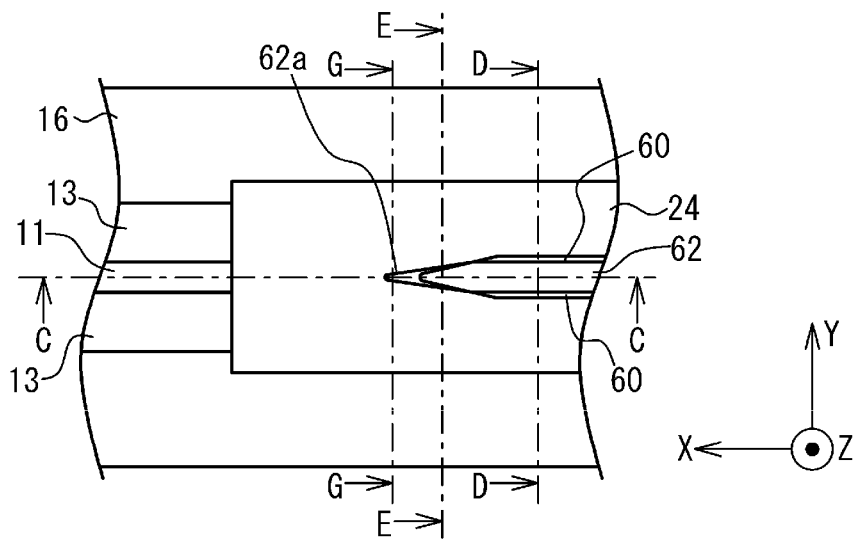
FIG. 6B is a plan view illustrating a method for producing a semiconductor optical device.

As illustrated in FIGS. 6B, 9B and 15A to 15C, the p-type semiconductor layer 26 is wet etched with a mixed solution of hydrochloric acid (HCl) and phosphoric acid as an etchant using the insulating film 60 and the patterned insulating film 62 as masks. FIG. 6B is a plan view after the wet etching. As illustrated in FIG. 6B, the p-type semiconductor layer 26 exposed from the insulating film 62 is etched to expose the core layer 24.

Figure 9B:
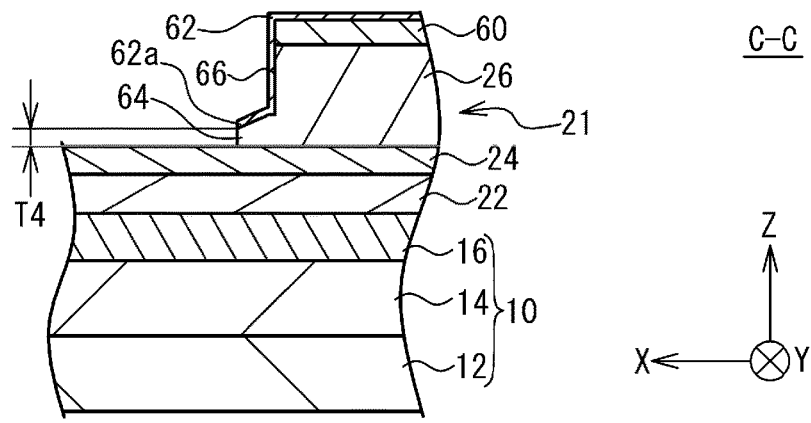
FIG. 9B is a cross-sectional view illustrating a method for producing a semiconductor optical device.
Figure 15A:
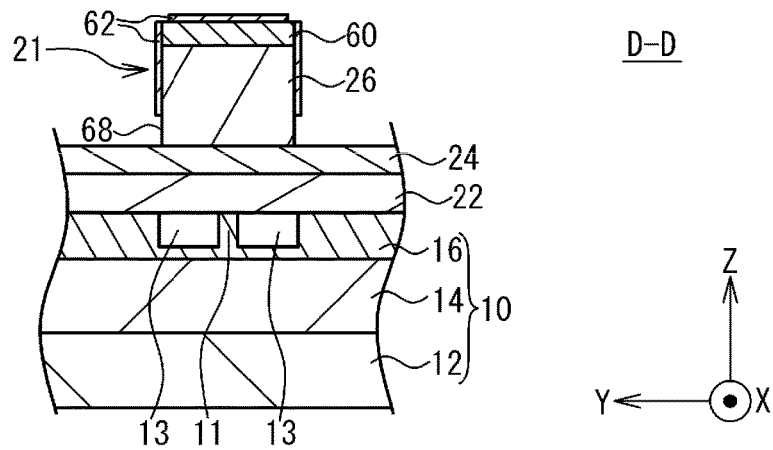
FIG. 15A is a cross-sectional view illustrating a method for producing a semiconductor optical device.
Figure 15B:
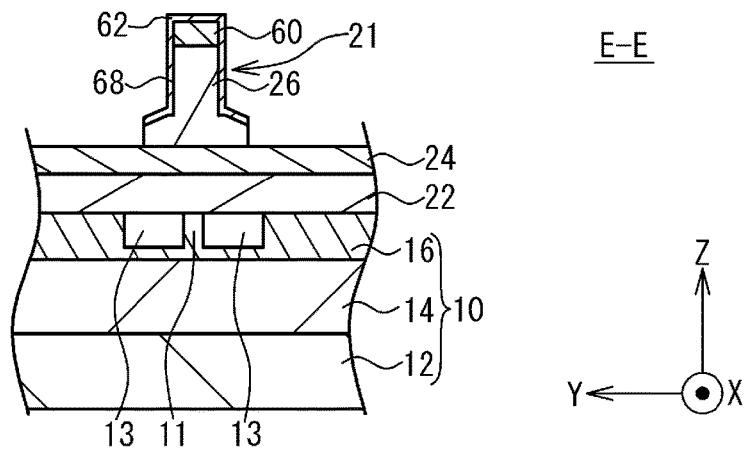
FIG. 15B is a cross-sectional view illustrating a method for producing a semiconductor optical device.
Figure 15C:
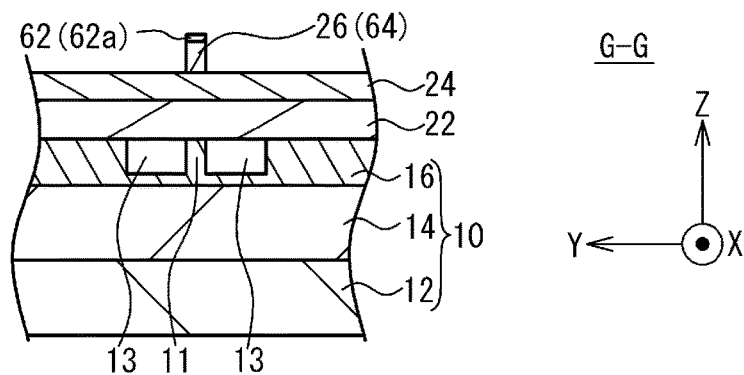
FIG. 15C is a cross-sectional view illustrating a method for producing a semiconductor optical device.

The FIG. 9B illustrates a cross-sectional view along line C-C in FIG. 6B. FIG. 15A illustrates a cross-sectional view along line D-D in FIG. 6B. FIG. 15B illustrates a cross-sectional view along line E-E in FIG. 6B. FIG. 15C illustrates a cross-sectional view along line G-G in FIG. 6B. The surface 66 of the p-type semiconductor layer 26 illustrated in FIG. 9B includes a plurality of crystallographic planes and is susceptible to wet etching. By protecting the surface 66 with the insulating film 62, inward wet etching from the surface 66 is suppressed.

As illustrated in FIGS. 9B and 15C, the remaining portion 64 of the p-type semiconductor layer 26 exposed from insulating film 62 is removed by wet etching. The remaining portion 64 near the mesa 21 is not removed because it is protected with the tip part 62a of the insulating film 62. A thickness T4 of the tip of the remaining portion 64 (the part under the tip part 62a) is, for example, from several tens of nanometers to 100 nm, which is smaller than a thickness T2 illustrated in FIG. 8B. Since the thickness T4 to be removed by wet etching is sufficiently small, the duration necessary for the wet etching is sufficiently short. By properly controlling the duration of wet etching, an etchant is less likely to penetrate from the thin tip of the remaining portion 64. The duration of wet etching required to remove the remaining portion depends on a mixing ratio of hydrochloric acid (HCl) and phosphoric acid in the etchant. Experimentally investigated beforehand, the duration of wet etching is set to be increased, for example, by 5% relative to the duration required for wet etching of the remaining portion 64 with the thickness T4. Although wet etching may proceed slightly into the remaining portion 64 under the insulating film 62, it stops without reaching the inside of the surface 66 of the p-type semiconductor layer 26.

As illustrated in FIGS. 15A and 15B, the remaining portion 65 of the p-type semiconductor layer 26 is removed by wet etching. The surface 68 is a (110) plane of InP and is less susceptible to wet etching than other crystallographic planes. Therefore, wet etching hardly proceeds inward from the surface 68. In the region where the remaining portions 64 and 65 are removed, the core layer 24 is exposed. The top surface of the core layer 24 becomes a flat and level surface with a little inclination.

Figure 7A:
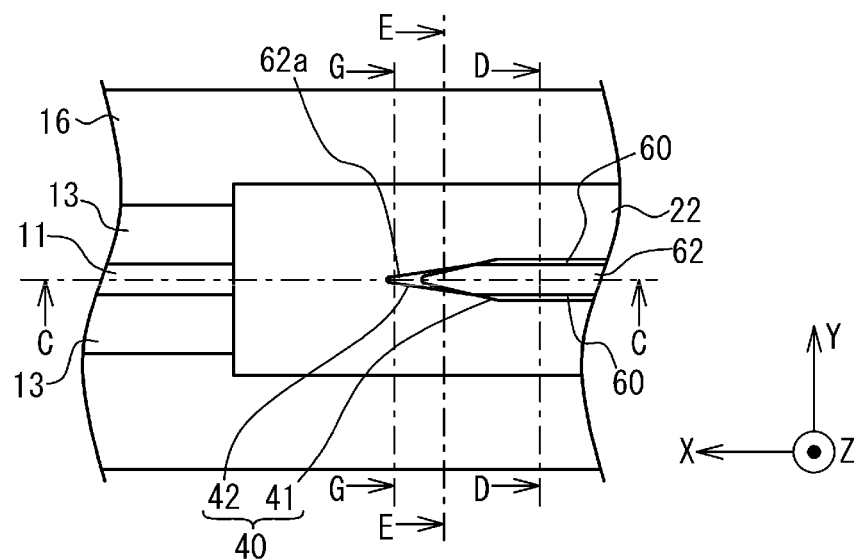
FIG. 7A is a plan view illustrating a method for producing a semiconductor optical device.
Figure 9C:
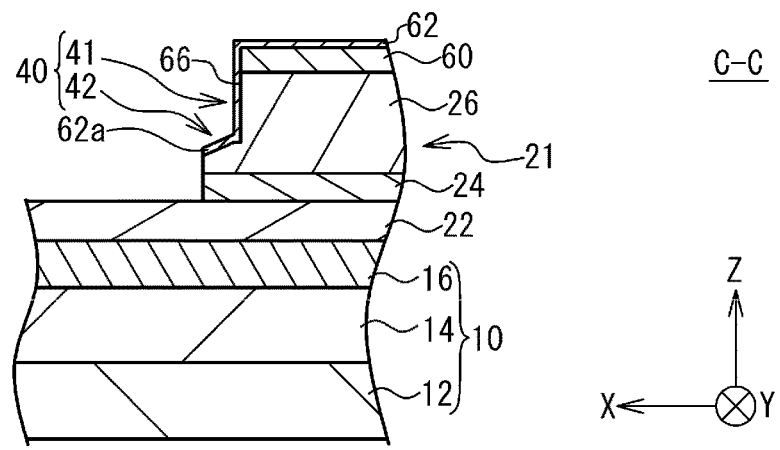
FIG. 9C is a cross-sectional view illustrating a method for producing a semiconductor optical device.
Figure 16A:
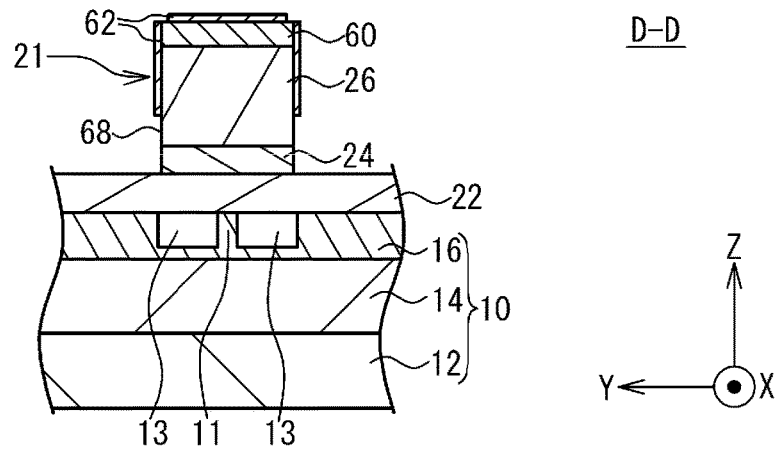
FIG. 16A is a cross-sectional view illustrating a method for producing a semiconductor optical device.
Figure 16B:
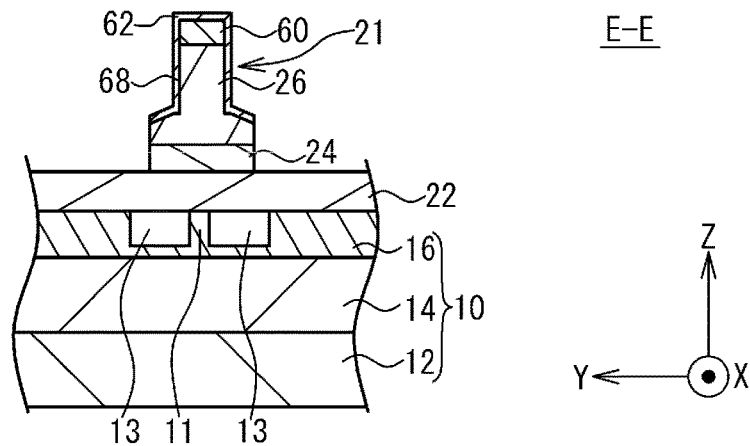
FIG. 16B is a cross-sectional view illustrating a method for producing a semiconductor optical device.
Figure 16C:
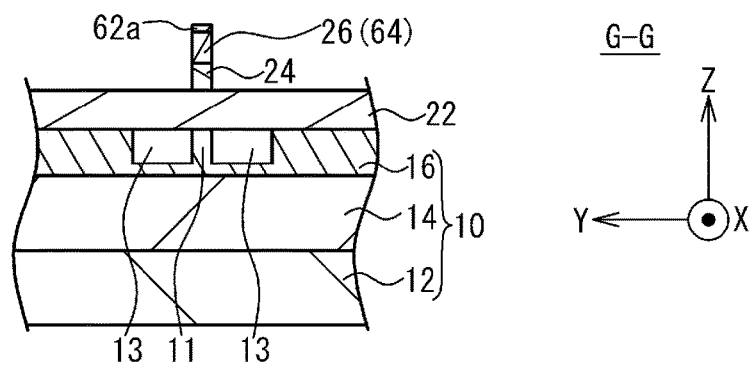
FIG. 16C is a cross-sectional view illustrating a method for producing a semiconductor optical device.

FIG. 7A is a plan view illustrating the configuration of the core layer 24 after dry etching. As illustrated in FIG. 7A, the core layer 24 is dry etched with the insulating films 60 and 62 as masks to form the tapered portion 40. FIG. 9C illustrates a cross-sectional view along line C-C in FIG. 7A. FIG. 16A illustrates a cross-sectional view along line D-D in FIG. 7A. FIG. 16B illustrates a cross-sectional view along line E-E in FIG. 7A. FIG. 16C illustrates a cross-sectional view along line G-G in FIG. 7A.

As illustrated in FIG. 7A, the core layer 24 exposed from the insulating films 60 and 62 is dry etched and the part of the core layer 24 covered with the insulating films 60 and 62 is not dry etched. After the dry etching, the core layer 24 may be removed to expose the n-type semiconductor layer 22, or the thin core layer 24 with a thickness of, for example, several tens of nanometers may remain. As illustrated in FIG. 9C, the surface of the core layer 24 on the tip side in the X-axis direction is flush with the surface on the tip side of the p-type semiconductor layer 26. As illustrated in FIGS. 16A to 16C, the sides of the core layer 24 are flush with the sides of the p-type semiconductor layer 26.

Figure 7B:
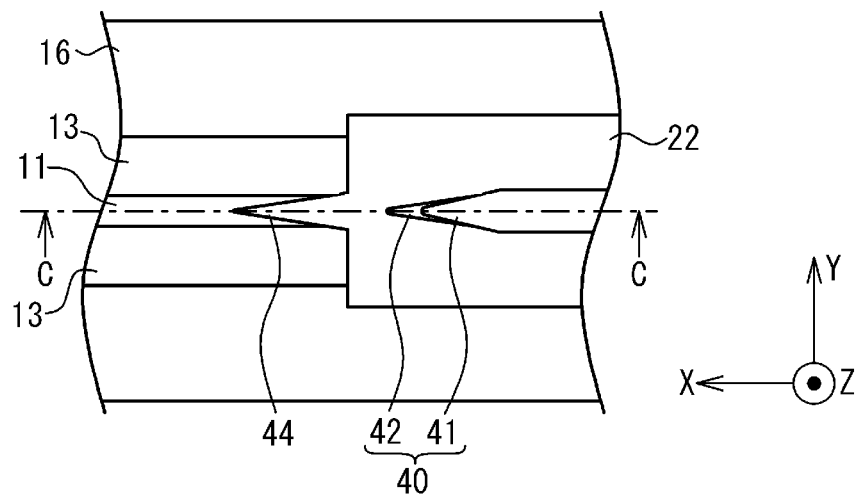
FIG. 7B is a plan view illustrating a method for producing a semiconductor optical device.
Figure 10:
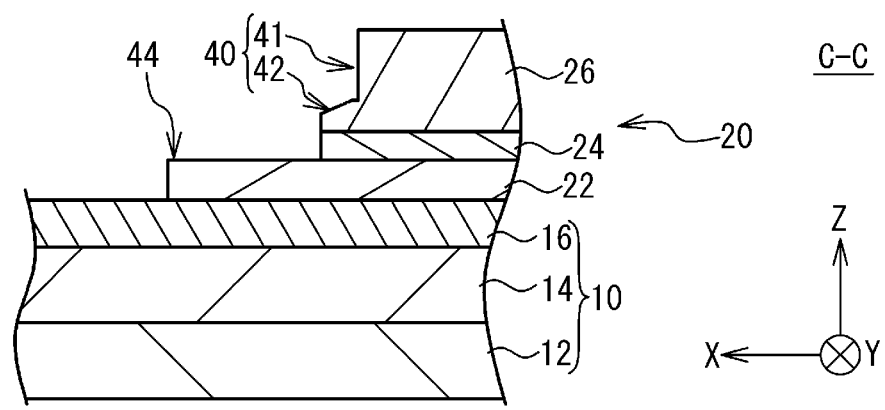
FIG. 10 is a cross-sectional view illustrating a method for producing a semiconductor optical device.

As illustrated in FIGS. 7B and 10, the tapered portion 44 is formed in the n-type semiconductor layer 22. FIG. 7B is a plan view illustrating the configuration after the tapered portion 44 is formed. FIG. 10 illustrates a cross-sectional view along line C-C in FIG. 7B. A mask (not illustrated) is formed on the n-type semiconductor layer 22 and the p-type semiconductor layer 26, and the n-type semiconductor layer 22 exposed from the mask is removed by dry etching, for example. Thus, the tapered portion 44 is formed in the n-type semiconductor layer 22. As illustrated in FIGS. 7B and 10, the tapered portion 44 is tapered along the X-axis direction, and aligned with the tapered portion 40 in the X-axis direction.

The insulating film 34 illustrated in FIG. 1B is formed by the plasma chemical vapor deposition (CVD) method or the like, and the electrodes 30 and 32 are formed by a vacuum deposition method or the like. Dicing process is subjected to the substrate 10 in wafer state, and a plurality of semiconductor optical devices 100 including the waveguide 11, the ring resonators 19 and the gain region 20 are obtained.

In the above method, the tapered portions 40 and 44, and the electrodes 30 and 32 are formed after bonding the semiconductor chip 50 to the substrate 10. The present embodiment can be applied to another method for producing the semiconductor optical device. For example, the tapered portions 40 and 44, the electrodes 30 and 32, and the like may be formed on a compound semiconductor wafer before bonding, then the wafer may be cut into chips including the gain region 20 and the chips may be bonded to the substrate 10.

COMPARATIVE EXAMPLE

Figure 17A:
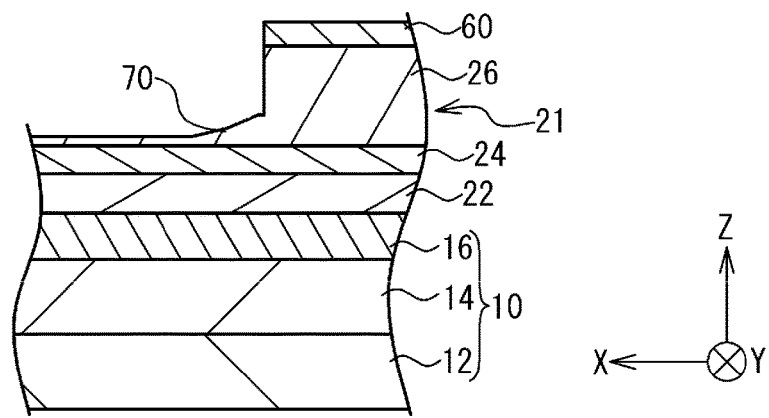
FIG. 17A is a cross-sectional view illustrating a method for producing a semiconductor optical device according to a comparative example.
Figure 17B:
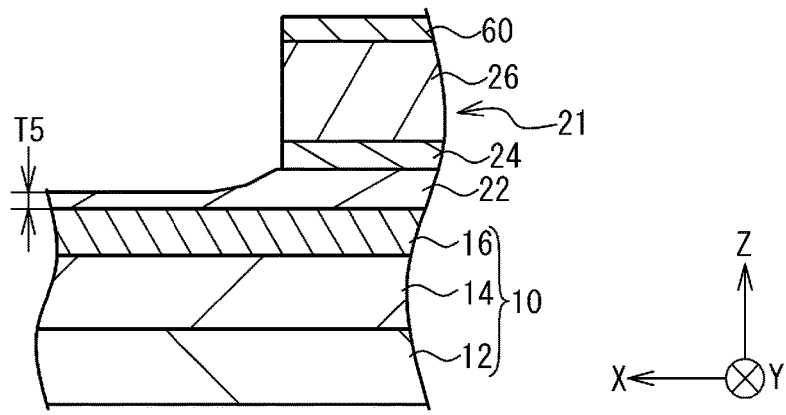
FIG. 17B is a cross-sectional view illustrating a method for producing a semiconductor optical device according to a comparative example.
Figure 18A:
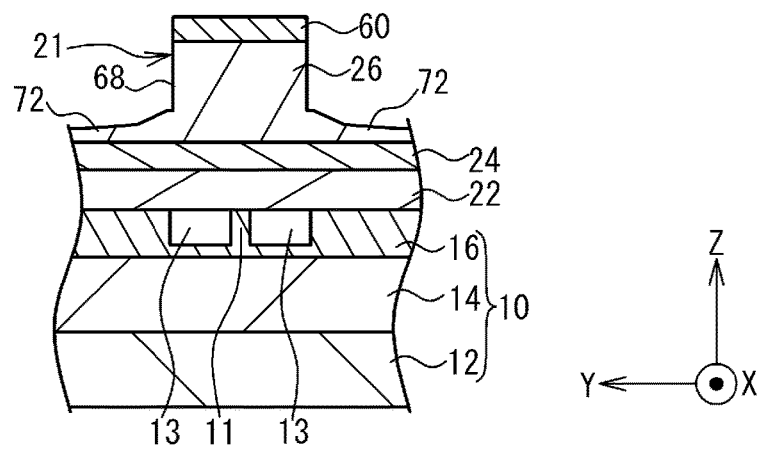
FIG. 18A is a cross-sectional view illustrating a method for producing a semiconductor optical device according to a comparative example.
Figure 18B:
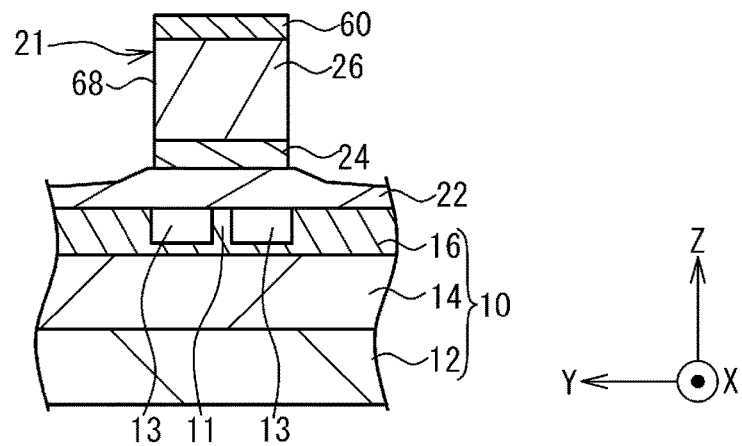
FIG. 18B is a cross-sectional view illustrating a method for producing a semiconductor optical device according to a comparative example.

FIGS. 17A to 18B are cross-sectional views illustrating a method for producing a semiconductor optical device according to a comparative example. FIGS. 17A and 17B illustrate cross-sectional views along the X-axis direction. FIGS. 18A and 18B illustrate cross-sectional views along the Y-axis direction.

In the comparative example, dry etching is not stopped partway in the thickness direction of the p-type semiconductor layer 26, but is performed until the core layer 24 is removed. That is, the p-type semiconductor layer 26 and the core layer 24 are dry etched at once in the same step. FIGS. 17A and 18A illustrate a middle stage of the dry etching of the p-type semiconductor layer 26. As illustrated in FIG. 17A, a remaining portion 70 is formed on the p-type semiconductor layer 26, and a remaining portion 72 is formed as illustrated in FIG. 18A. The remaining portions 70 and 72 trail hems from the mesa 21 and are thicker on the side closer to the mesa 21 and thinner on the side farther from the mesa 21.

Dry etching further proceeds from the states illustrated in FIGS. 17A and 18A, and the core layer 24 is removed as illustrated in FIGS. 17B and 18B. The dry etching causes a variation in thickness of the n-type semiconductor layer 22 due to the remaining portions 70 and 72. That is, the difference in the thickness in the remaining portions 70 and 72 having a shape like trailing a hem is transferred to the n-type semiconductor layer 22, so that the n-type semiconductor layer 22 is thicker on the side closer to the mesa 21 and thinner on the side farther from the mesa 21. A thickness T5 from the top surface of the Si layer 16 to the top surface of the n-type semiconductor layer 22 illustrated in FIG. 17B is, for example, a processing amount of the dry etching, that is, about 10% of the total thickness of the p-type semiconductor layer 26 and the core layer 24, and is 200 nm, for example.

The film thickness changes in the n-type semiconductor layer 22, and the tip shape of the gain region 20 deviates from a design. Consequently, the refractive index also deviates from the desired value, and the coupling efficiency between the gain region 20 and the waveguide 11 decreases, resulting in an increase in the optical loss.

In contrast, according to the present embodiment, the p-type semiconductor layer 26 is etched partway in the thickness direction, as illustrated in FIGS. 8B and 12B, to leave the remaining portions 64 and 65. Thereafter, as illustrated in FIGS. 9A and 14A to 14C, the insulating film 62 is formed so as to cover from the covered portion with the insulating film 60 of the p-type semiconductor layer 26 to the part of the remaining portion 64. As illustrated in FIGS. 9B, 15A to 15C, the parts of the remaining portions 64 and 65 exposed from the insulating film 62 are removed by wet etching, followed by dry etching of the core layer 24. Through the above steps, the tapered portion 40 illustrated in FIG. 7A is formed.

By removing the remaining portions 64 and 65 by wet etching, the variation in thickness of the n-type semiconductor layer 22 due to the remaining portions 64 and 65 is suppressed. The flatness of the n-type semiconductor layer 22 is ensured, and the top surface of the n-type semiconductor layer 22 becomes the level surface with a suppressed inclination. That is, an angle between the n-type semiconductor layer 22 and the surface 66 of the mesa 21, and an angle between the n-type semiconductor layer 22 and the surface 68 approach 90°. As a result, the tapered portion 40 having the desired shape can be formed, and the deviation of the refractive index of the gain region 20 from a design value is suppressed. At the tapered portions 40 and 44, the effective refractive index of the gain region 20 gradually changes and light transitions from the gain region 20 to the waveguide 11. The higher coupling efficiency of, for example, 90% or more can be obtained between the gain region 20 and the waveguide 11.

As illustrated in FIG. 9A, the insulating film 62 continuously covers the surface 66 on the tip side and the part of the remaining portion 64 in the p-type semiconductor layer 26, and also covers the surface 68 of the p-type semiconductor layer 26 in the Y-axis direction as illustrated in FIGS. 14A and 14B.

Since the p-type semiconductor layer 26 is protected with the insulating film 62, wet etching is suppressed from progressing inward from the surface 66. The surface 66 is formed in the same shape as the tip shape of the base portion 41 illustrated in FIG. 7A (plan view), and every crystallographic planes are exposed. Therefore, the surface 66 includes a crystallographic plane that is susceptible to wet etching, but the insulating film 62 covers the surface 66, thereby suppressing the progress of wet etching inward from the surface 66. The part of the remaining portion 64 far from the mesa 21 is exposed from the insulating film 62, and the part of the remaining portion 64 close to the mesa 21 is covered with the insulating film 62. The part of the remaining portion 64 close to the mesa 21 is to be the tip portion 42 of the tapered portion 40. Since the tip portion 42 is thinner than the mesa 21, the etchant for wet etching is less likely to penetrate and lateral wet etching is less likely to proceed. Wet etching may proceed slightly inside the tip portion 42, but stops without reaching the part of the p-type semiconductor layer 26 that is inside the surface 66. As a result, it is possible to suppress the shape of the tapered portion 40 from collapsing and to realize a higher yield.

The base portion 41 and the tip portion 42 are formed in the tapered portion 40. The tip portion 42 has a thinner and sharper shape than the base portion 41. By providing the tip portion 42 in the tapered portion 40, the coupling efficiency between the gain region 20 and the waveguide 11 is further improved as compared with the case where the tip portion 42 is not provided. In this manner, the tapered portion 40 substantially has a structure including a plurality of steps, so that the effective change in the refractive index of the tapered portion 40 becomes gradual. The tapered portion 40 of the p-type semiconductor layer 26 and the tapered portion 44 of the n-type semiconductor layer 22 improve the coupling efficiency between the gain region 20 and the waveguide 11. The combination of the tapered portion 40 of the p-type semiconductor layer 26 and the tapered portion 44 of the n-type semiconductor layer 22 can improve the final coupling efficiency, for example, by about 5% or less. Since the coupling efficiency is about 90% when the tapered portion 40 is not provided with the plurality of steps, the improvement of several percent by providing the tapered portion 40 with the plurality of steps is highly effective. In the case, for example, where the semiconductor optical device 100 generates laser light and the light makes one round trip between the ring resonators 19 disposed on both sides of the semiconductor optical device 100, there are two tapered portions at each end of the gain region 20, and thus the light passes the tapered portions four times during the one round trip of light between. Therefore, when the coupling efficiency is x %, the light lost in the tapered portions is obtained by the following equation.

$$\text{lost light} = 1 - (x/100)^4 \qquad \text{(Equation)}$$

When the coupling efficiency of the tapered portion is 90%, the light lost in the tapered portions is approximately 35% according to the above equation. On the other hand, when the coupling efficiency of the tapered portion is 95%, the lost light is 19%, and hence the optical loss can be reduced by half.

As illustrated in FIGS. 14A and 14B, the remaining portion 65 is exposed from the insulating film 62. Wet etching removes the remaining portion 65 and proceeds to the surface 68 of the mesa 21. Since the surface 68 of the mesa 21 is not susceptible to wet etching, wet etching stops at the surface 68.

The insulating film 62 may be subjected to patterning by dry etching. Wet etching may cause removing the part of the insulating film 62 that covers the sides of the mesa 21. On the other hand, since dry etching easily proceeds in the thickness direction (Z-axis direction), the part of the insulating film 62 covering the sides of the mesa 21 is less susceptible to damage, and unnecessary parts on the remaining portions 64 and 65 can be removed.

The remaining portions 64 and 65 are removed by wet etching the part of the p-type semiconductor layer 26 exposed from the insulating film 62. The wet etching proceeds selectively to the p-type semiconductor layer 26 as compared to the core layer 24 and stops when reaching the top surface of the core layer 24. Therefore, the flatness of the core layer 24 is ensured, and the variation in thickness is suppressed. Thereafter, the tapered portion 40 is formed by dry etching the core layer 24. By selectively wet etching to the p-type semiconductor layer 26 and dry etching to the core layer 24, the tapered portion 40 can be formed with the desired shape, and thus the higher coupling efficiency can be achieved.

The p-type semiconductor layer 26 is, for example, an InP layer or the like, and is a compound semiconductor layer containing InP. The core layer 24 is, for example, a compound semiconductor layer containing As such as GaInAs. Therefore, the selectivity of wet etching increases and wet etching proceeds to the p-type semiconductor layer 26 and stops when reaching the core layer 24. As a result, the tapered portion 40 having the desired shape can be formed, and the higher coupling efficiency can be realized. The n-type semiconductor layer 22 also contains InP as the same as the p-type semiconductor layer 26. The n-type semiconductor layer 22 and the p-type semiconductor layer 26 function as the cladding layers. The core layer 24, the p-type semiconductor layer 26, and the n-type semiconductor layer 22 may contain III-V group compound semiconductors other than the above.

Light leaks upward from the gain region 20 and loses significantly when it reaches the electrode 32 illustrated in FIG. 1B. An amount of light leakage from the core layer 24 is determined by a difference in refractive index between the InP layer (n-type semiconductor layer 22 and p-type semiconductor layer 26) and the core layer 24. The core layer 24 has a MQW structure as described above, which is a multilayer structure including layers having different refractive indexes. An average refractive index of the core layer 24 is about 3.3, for example. On the other hand, a refractive index of InP is about 3.19. Since the difference in refractive index between the core layer 24, and the n-type semiconductor layer 22 and the p-type semiconductor layer 26 that contain InP is smaller than the difference in refractive index between Si and $SiO_2$, light tends to leak from the core layer 24 to the n-type semiconductor layer 22. In order for the leaked light not to reach the electrode, the thickness of the p-type semiconductor layer 26 is larger than those of the core layer 24 and the n-type semiconductor layer 22, and is preferably 2 m or more.

On the other hand, as the p-type semiconductor layer 26 becomes thicker, the effect on the thickness of the n-type semiconductor layer 22 due to the etching of the p-type semiconductor layer 26 becomes larger. In the comparative example, the variation in the thickness of the n-type semiconductor layer 22 is about 10% of the thickness to be etched. For example, when the thickness of the p-type semiconductor layer 26 is 2 μm, the variation in film thickness is 200 nm. In the present embodiment, the etching of the p-type semiconductor layer 26 is stopped partway, and the remaining portions 64 and 65 are removed by etching after the stop of the above partial etching, thereby suppressing the effect on the thickness of the n-type semiconductor layer 22. Therefore, it is possible to suppress the optical loss by the thicker p-type semiconductor layer 26 and to form the tapered portion 40 having the desired shape.

By intentionally stopping the etching of the p-type semiconductor layer 26 while leaving the remaining portions 64 and 65 with appropriate thicknesses, the variation in the thickness of the n-type semiconductor layer 22 is suppressed. The dry etching is performed as deep as possible to the extent that the dry etching does not reach the core layer 24 in the area to be etched. However, the dry etching is performed so as not to reach the core layer 24. The thickness of the remaining portions 64 and 65 is, for example, 10% or more and 20% or less of the thickness of the p-type semiconductor layer 26 before the etching, and may be 5% or more, 25% or less, or 30% or less of the thickness of the p-type semiconductor layer 26 before the etching.

The p-type semiconductor layer 26 is dry etched. The dry etching proceeds in the thickness direction of the p-type semiconductor layer 26 and can leave the remaining portions 64 and 65 in the p-type semiconductor layer 26 by stopping the etching partway. For example, etching conditions such as an etching time are adjusted to control the thicknesses of the remaining portions 64 and 65.

The core layer 24 is thinner than the p-type semiconductor layer 26, and the thickness of the core layer 24 is about 300 nm. The thickness of the trailed hem of the core layer 24 (corresponding to the remaining portion of the p-type semiconductor layer 26 after dry etching) which may occur after dry etching is about 30 nm, which is about 10% of the thickness of the core layer 24 before the dry etching, and is very small. Therefore, the effect on the thickness of the n-type semiconductor layer 22 is extremely small.

By thinning the insulating film 62, the tapered portion 40 can be made thin and sharp. However, when the insulating film 62 is too thin, it is difficult to protect the p-type semiconductor layer 26 from wet etching. In order to form a thin and sharp tapered portion 40 and suppress the progress of wet etching to the p-type semiconductor layer 26, the thickness of the insulating film 62 is preferably smaller than the thickness of the insulating film 60, and is preferably 30 nm or more and 100 nm or less, for example. In order to suppress the progress of wet etching to the p-type semiconductor layer 26, it is preferable to form the dense insulating film 62 without holes. The insulating film 62 can be formed by the ALD method, the plasma chemical vapor deposition (CVD) method, or the like.

The embodiments of the present disclosure have been described above. However, the embodiments of the present disclosure disclosed above are only illustrative, and the scope of the present invention is not limited to the specific embodiments of the disclosure. It is to be understood that the scope of the present invention is defined in the appended claims and includes equivalence of the description of the claims and all changes within the scope of the claims.

What is claimed is:

1. A method for producing a semiconductor optical device comprising:
   bonding a semiconductor chip to an SOI substrate having a waveguide, the semiconductor chip having an optical gain and including a first cladding layer, a core layer, and a second cladding layer that contain III-V group compound semiconductors and are sequentially stacked in this order;
   forming a covered portion with a first insulating layer on the second cladding layer;
   etching partway in a thickness direction the second cladding layer exposed from the first insulating film;
   forming a second insulating film covering from the covered portion with the first insulating layer of the second cladding layer to a part of a remaining portion of the second cladding layer that remains in a region of the second cladding layer etched partway in the thickness direction; and forming a first tapered portion that is disposed on the waveguide and tapered along an extending direction of the waveguide by etching the core layer and the second cladding layer that are exposed from the second insulating film.

2. The method for producing the semiconductor optical device according to claim 1, wherein the forming the second insulating film is performed by forming the second insulating film so as to continuously cover a first surface in the extending direction of the waveguide in the covered portion of the second cladding layer covered with the first insulating film and the part of the remaining portion of the second cladding layer along the extending direction of the waveguide, and cover a second surface in a direction intersecting the extending direction of the waveguide in the covered portion of the second cladding layer covered with the first insulating film.

3. The method for producing the semiconductor optical device according to claim 1, wherein the forming the second insulating film includes patterning the second insulating film by dry etching.

4. The method for producing the semiconductor optical device according to claim 1, wherein the forming the first tapered portion includes wet etching the second cladding layer exposed from the second insulating film, and dry etching the core layer exposed from the second insulating film after the wet etching.

5. The method for producing the semiconductor optical device according to claim 1, wherein the second cladding layer contains indium phosphide, and the core layer contains arsenic.

6. The method for producing the semiconductor optical device according to claim 1, wherein the second cladding layer is thicker than the core layer and the first cladding layer.

7. The method for producing the semiconductor optical device according to claim 1, wherein a thickness of the remaining portion of the second cladding layer is 20% or less of a thickness of the second cladding layer before the etching.

8. The method for producing the semiconductor optical device according to claim 1, wherein the etching the second cladding layer partway in the thickness direction is performed by dry etching the second cladding layer.

9. The method for producing the semiconductor optical device according to claim 1, further comprising:

etching the first cladding layer to form a second tapered portion tapered along the extending direction of the waveguide.

* * * * *